(12) United States Patent
Ruoff et al.

(10) Patent No.: US 10,037,855 B2
(45) Date of Patent: Jul. 31, 2018

(54) ULTRACAPACITOR WITH A NOVEL DOPED CARBON

(71) Applicant: Board of Regents, The University of Texas System, Austin, TX (US)

(72) Inventors: Rodney S. Ruoff, Busan (KR); Li Li Zhang, Jurong Island (SG); Meryl D. Stoller, Austin, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 124 days.

(21) Appl. No.: 15/051,350

(22) Filed: Feb. 23, 2016

(65) Prior Publication Data

US 2016/0254102 A1    Sep. 1, 2016

Related U.S. Application Data

(63) Continuation of application No. PCT/US2014/053557, filed on Aug. 30, 2014.

(60) Provisional application No. 61/872,471, filed on Aug. 30, 2013.

(51) Int. Cl.
| | |
|---|---|
| H01B 1/04 | (2006.01) |
| B82Y 30/00 | (2011.01) |
| H01G 11/34 | (2013.01) |
| C01B 31/04 | (2006.01) |
| C23C 16/26 | (2006.01) |
| H01G 11/32 | (2013.01) |
| H01M 4/583 | (2010.01) |
| H01M 4/62 | (2006.01) |
| H01M 4/86 | (2006.01) |
| H01M 4/90 | (2006.01) |
| H01G 11/36 | (2013.01) |
| H01G 11/68 | (2013.01) |

(52) U.S. Cl.
CPC .......... *H01G 11/34* (2013.01); *C01B 31/043* (2013.01); *C01B 31/0453* (2013.01); *C01B 31/0484* (2013.01); *C23C 16/26* (2013.01); *H01G 11/32* (2013.01); *H01G 11/36* (2013.01); *H01G 11/68* (2013.01); *H01M 4/583* (2013.01); *H01M 4/624* (2013.01); *H01M 4/8673* (2013.01); *H01M 4/9083* (2013.01); *Y02E 60/13* (2013.01)

(58) Field of Classification Search
CPC ..... C01B 31/043; C01B 31/0453; H01B 1/04; H01B 1/24; B82Y 30/00; B82Y 40/00
USPC ................... 252/500, 502, 510, 511
See application file for complete search history.

(56) References Cited

U.S. PATENT DOCUMENTS

| | | | | |
|---|---|---|---|---|
| 2012/0237435 A1* | 9/2012 | Petrik | ............... | B82Y 30/00 |
| | | | | 423/447.1 |
| 2013/0069011 A1* | 3/2013 | Thomas | ............... | H01B 1/04 |
| | | | | 252/502 |

OTHER PUBLICATIONS

Wang ("Graphene oxide doped polyaniline for supercapacitors" Electrochemistry Communications 11 (2009) 1158-1161).*

(Continued)

*Primary Examiner* — Tri V Nguyen
(74) *Attorney, Agent, or Firm* — Baker Botts L.L.P.

(57) ABSTRACT

Doped activated microwave expanded graphite oxide materials and doped monolayer graphene materials, and methods of making these materials. The materials exhibit increased capacitance relative to undoped activated microwave expanded graphite oxide and monolayer graphene. The materials are suitable for use in, for example, ultracapacitors.

7 Claims, 16 Drawing Sheets

(56) References Cited

OTHER PUBLICATIONS

Stach ("High-resolution characterization of activated graphene for supercapacitor applications." Microscopy and Microanalysis, suppl. Proceedings of Microscopy & Microanalysis 2012; Cambridge18. S2 (Jul. 2012): 1536-1537).*
Jiang ("Highly concentrated, stable nitrogen-doped graphene for supercapacitors: Simultaneous doping and reduction." Applied Surface Science 258, pp. 3438-3443 pub online Dec. 14, 2011).*
International Search Report and Written Opinion of the International Searching Authority for PCT/US2014/053557 International Filing Date Aug. 29, 2014, 11 pages, dated Feb. 4, 2015.
Li Li Zhang et al., "Nitrogen doping of graphene and its effect on quantum capacitance, and a new insight on the enhance capacitance of N-doped carbon", Energy & Environmental Science, vol. 5, No. 11, Sep. 14, 2012, p. 9618-9625.
PCT International Preliminary Report and Written Opinion of International application No. PCT/US2014/053557 filed Aug. 29, 2014, 8 pages, dated Mar. 1, 2016.

* cited by examiner

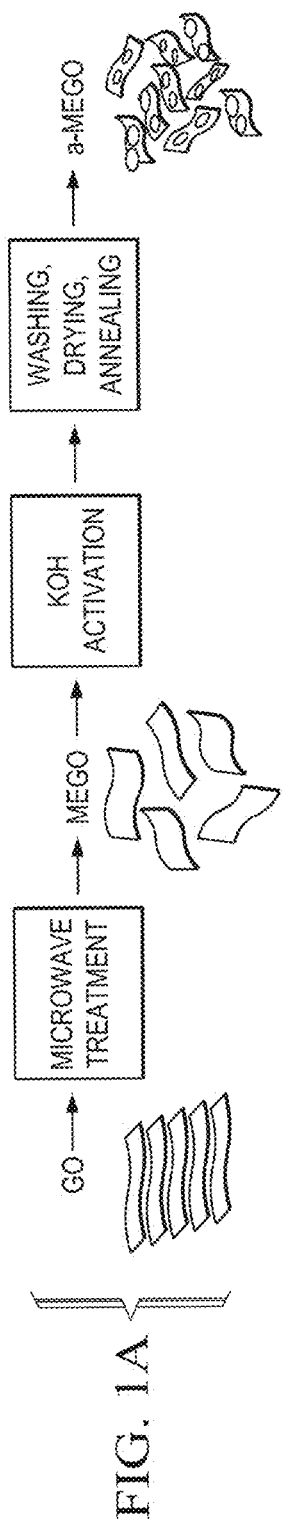
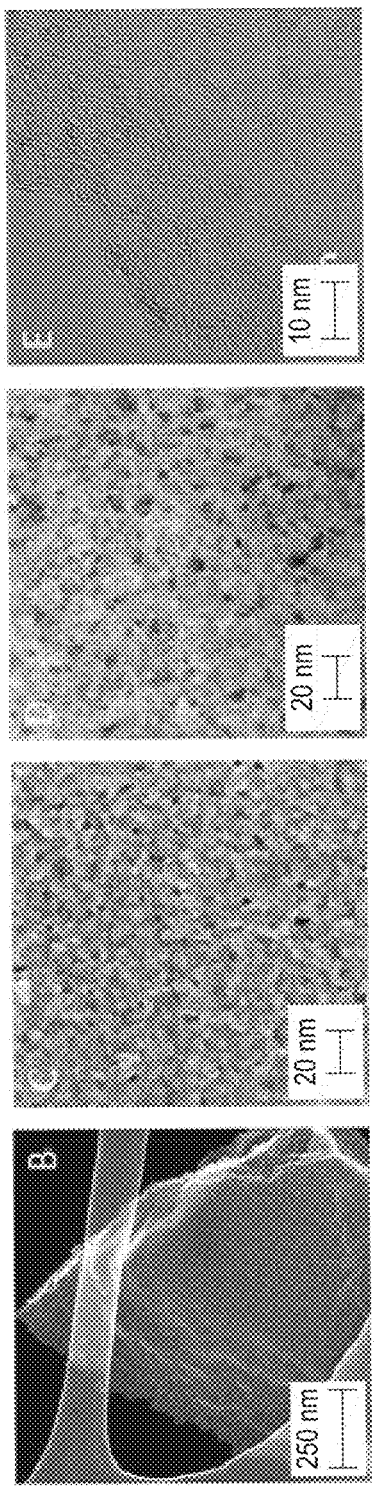
FIG. 1A
FIG. 1B
FIG. 1C
FIG. 1D
FIG. 1E

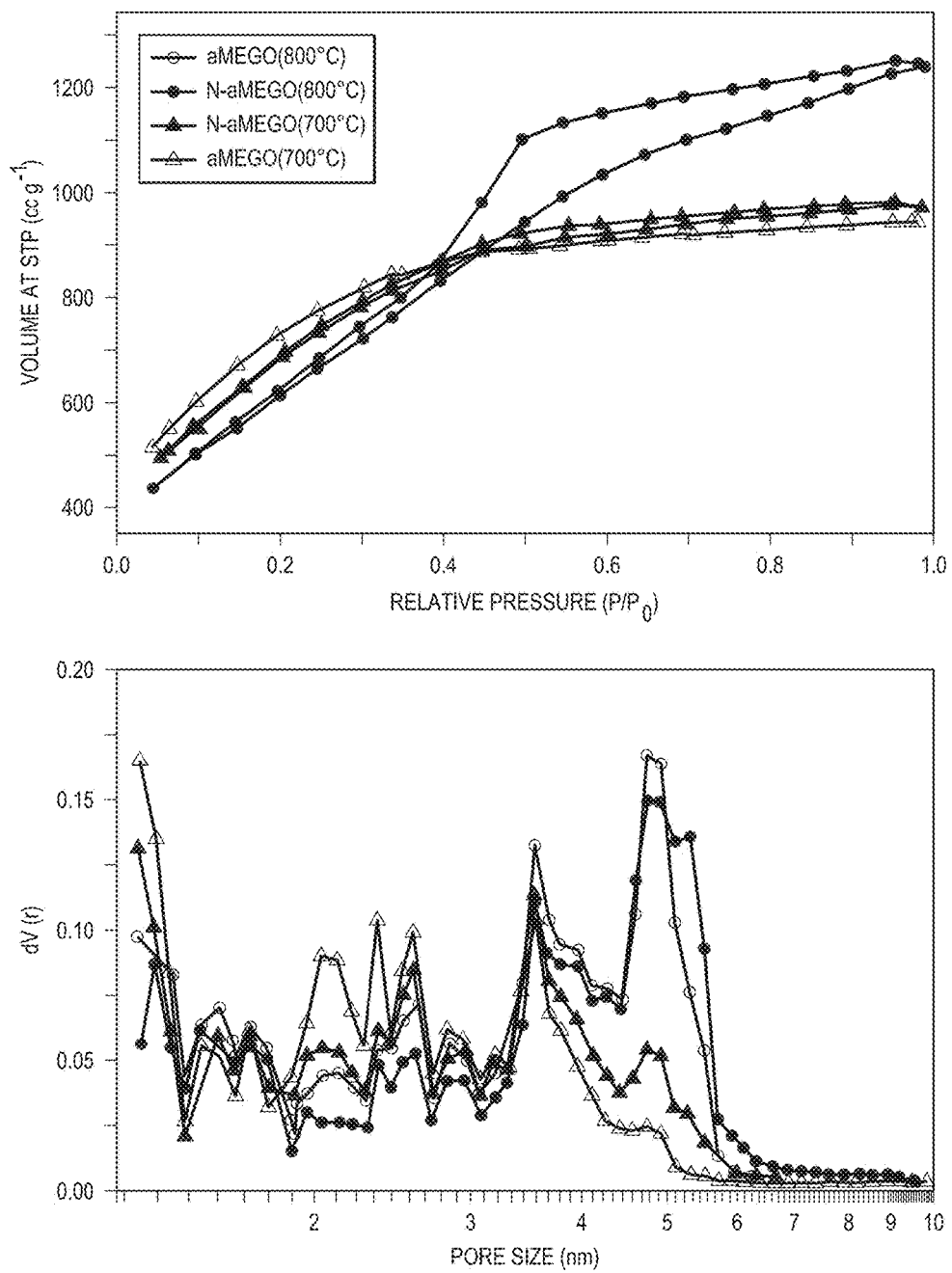

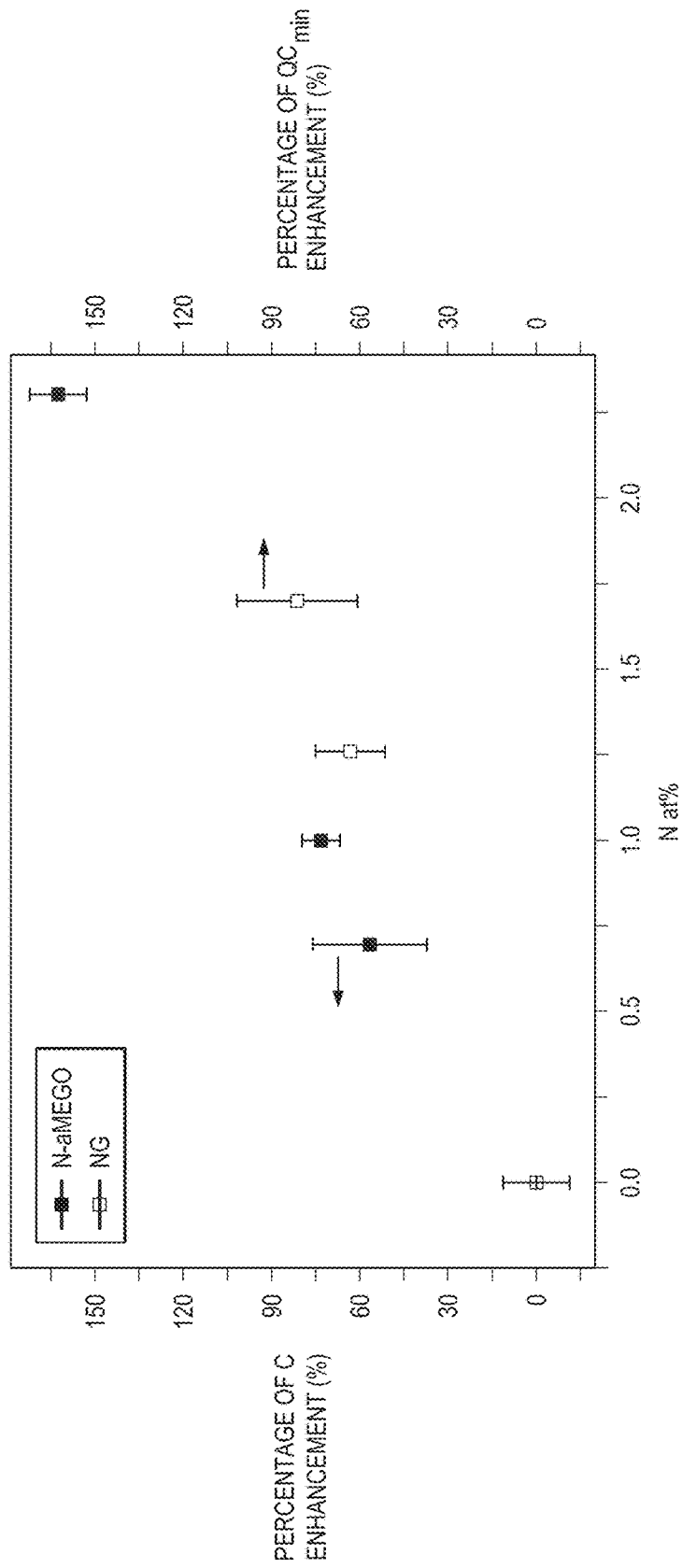

ULTRACAPACITOR WITH A NOVEL DOPED CARBON

RELATED APPLICATIONS

This application is a continuation application of International Application No. PCT/US2014/053557 filed Aug. 30, 2014, which designates the United States, which claims priority to U.S. Provisional Application Ser. No. 61/872,471 filed Aug. 30, 2013, and which is incorporated herein by reference in its entirety.

STATEMENT OF GOVERNMENT INTEREST

At least portions of this invention were made using U.S. government funding provided by the Department of Energy under grant number DE-SC0001951. The U.S. government has certain rights in the invention.

TECHNICAL FIELD

The present disclosure relates to capacitors, and specifically to carbon materials that can be used in capacitors.

TECHNICAL BACKGROUND

The increasing demand for electrical energy requires continuous development of improved energy storage technologies. Batteries store and release energy via chemical reactions, but have limited storage capabilities. While batteries can achieve high energy density values, discharge rates are typically limited by the chemical reactions. In contrast, ultracapacitors do not rely on chemical reactions to release energy. As such, ultracapacitors, also referred to as supercapacitors, can be charged and discharged rapidly.

Ultracapacitors, also called supercapacitors or electrochemical capacitors, are a potential solution for meeting the world's electrical energy storage needs. Vastly accelerated adoption of ultracapacitor technology, now mainly based on porous carbons, is currently limited by the low energy storage density and relatively high effective series resistance of these materials.

Ultracapacitors store energy by forming a double layer of electrolyte ions on the surface of conductive electrodes. Ultracapacitors are not limited by the electrochemical charge transfer kinetics of batteries and thus can operate at very high charge and discharge rates, and can have lifetimes of over a million cycles; however, the energy stored in ultracapacitors is currently an order of magnitude lower than batteries. The limited energy storage of ultracapacitors limits their use to those applications that require high cycle life and power density. The energy density of conventional state-of-the-art ultracapacitor devices, mainly based on porous activated carbon (AC), is about 4-5 Wh/Kg while that of lead acid batteries is in the range 26-34 Wh/Kg. A conventional AC material, with a specific surface area (SSA) in the range of 1,000-2,000 $m^2/g$ and a pore size distribution in the range of 2-5 nm, can have a gravimetric capacitance of 100-120 F/g in an organic electrolyte.

Significant research has thus been focused on increasing energy density without sacrificing cycle life or high power density. Ultrathin, high surface area carbon films including graphene and graphene-like materials have been identified as promising candidates for use as ultracapacitor electrodes. However, it has been observed that the storage capacity of these materials in ultracapacitors is intrinsically limited. For example, activated microwave expanded graphite oxide ('aMEGO') materials having high surface area and energy density have been recently described. These materials, however, may exhibit saturation of capacitance at lower than desirable levels. Similarly, recent investigations of "pristine" monolayer graphene have shown that the area-normalized charge storage of suspended monolayer graphene that can be stored simultaneously on both sides of a graphene monolayer is significantly lower than could be stored on a single side of a graphene monolayer.

Thus, there is a need to address the problems and other shortcomings associated with existing ultracapacitor technology and carbon materials for use therein. These needs and other needs are satisfied by the compositions and methods of the present disclosure.

SUMMARY

In accordance with the purpose(s) of the invention, as embodied and broadly described herein, this disclosure, in one aspect, relates to capacitors, and specifically to carbon materials that can be used in capacitors.

In one aspect, the present disclosure provides a method for making doped activated microwave expanded graphite oxide ("aMEGO") comprising expanding and reducing graphite oxide with microwave expanded graphite oxide, and chemically activating the microwave expanded graphite oxide in the presence of a dopant. In still another aspect, the present disclosure provides a method of producing doped graphene films comprising heating a metal or dielectric substrate in a chemical vapor deposition apparatus and introducing a flow of a gaseous carbon source and a gaseous source of the dopant element. In further aspects of the present disclosure, doped aMEGO and doped graphene films are provided.

Additional aspects of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE FIGURES

The accompanying figures, which are incorporated in and constitute a part of this specification, illustrate several aspects and together with the description serve to explain the principles of the invention.

FIG. 1A is a schematic showing the microwave exfoliation/reduction of graphite oxide and the following chemical activation of microwave exfoliated graphite oxide (MEGO) with potassium hydroxide (KOH) according to a prior art method of aMEGO synthesis, FIG. 1B is a low magnification scanning electron microscopy (SEM) image of an undoped 3D aMEGO chunk, FIG. 1C is a high-resolution SEM image of a different sample region of the same chunk, FIG. 1D is an annular dark-field scanning transmission electron microscopy (ADF-STEM) image of the same area depicted in FIG. 1C, FIG. 1E is a high magnification phase contrast electron microscopy image of the thin edge of an undoped aMEGO chunk, taken at 80 kV.

FIG. 4A is Nitrogen adsorption isotherms and pore size distribution of doped aMEGO electrodes.

FIG. 9D a plot of capacitance enhancement and dopant concentration in the graphene and aMEGO materials disclosed herein.

DESCRIPTION

Figure 1F:
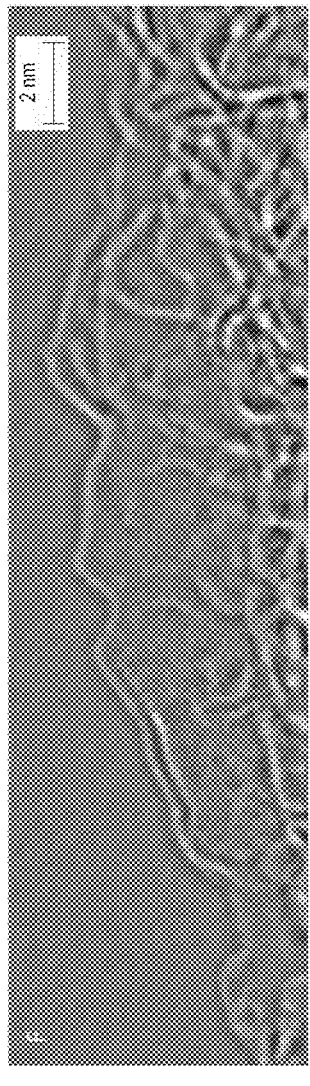
FIG. 1F is an exit wave reconstructed high resolution transmission electron microscopy (HRTEM) image from the edge of undoped aMEGO.

The present invention can be understood more readily by reference to the following detailed description of the invention and the Examples included therein.

Before the present compounds, compositions, articles, systems, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Although any methods and materials similar or equivalent to those described herein can be used in the practice or testing of the present invention, example methods and materials are now described.

Definitions

As used in the specification and the appended claims, the singular forms "a," "an" and "the" include plural referents unless the context clearly dictates otherwise. Thus, for example, reference to "a solvent" includes mixtures of two or more solvents.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "optional" or "optionally" means that the subsequently described event or circumstance can or can not occur, and that the description includes instances where said event or circumstance occurs and instances where it does not.

Throughout this specification, unless the context requires otherwise, the word "comprise," or variations such as "comprises" or "comprising," will be understood to imply the inclusion of a stated integer or step or group of integers or steps but not the exclusion of any other integer or step or group of integers or steps.

Disclosed are the components to be used to prepare the compositions of the invention as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds can not be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific embodiment or combination of embodiments of the methods of the invention.

It is understood that the compositions disclosed herein have certain functions. Disclosed herein are certain structural requirements for performing the disclosed functions, and it is understood that there are a variety of structures that can perform the same function that are related to the disclosed structures, and that these structures will typically achieve the same result.

As briefly discussed above, the present disclosure provides doped carbon materials that can be used in a capacitor, such as, for example, an ultracapacitor.

Ultracapacitors, also called supercapacitors or electrochemical capacitors, are a potential solution to meeting the world's electrical energy storage needs. Vastly accelerated adoption of ultracapacitor technology, now mainly based on porous carbons, is currently hindered by their low energy storage density and relatively high effective series resistance. Ultracapacitors store energy by forming a double layer of electrolyte ions on the surface of conductive electrodes. Ultracapacitors are not limited by the electrochemical charge transfer kinetics of batteries and thus can operate at very high charge and discharge rates, and can have lifetimes of over a million cycles; however, the energy stored in conventional ultracapacitors can be about an order of magnitude lower than batteries. Such lower energy storage values can limit the adoption of ultracapacitors to applications that require high cycle life and power density. In one aspect, the energy density of conventional ultracapacitor devices, mainly based on porous activated carbon (AC), is about 4-5 Wh/Kg, while that of lead acid batteries is in the range 26-34 Wh/Kg. A conventional AC material with a SSA in the range of 1,000 $m^2$/g to 2,000 $m^2$/g and a pore size distribution in the range of 2 nm to 5 nm, can have a gravimetric capacitance of 100-120 F/g in organic electrolytes. A significant amount of research has been focused on increasing energy density for ultracapacitor materials without sacrificing cycle life or high power density. For example, capacitance increases have been reported in the organic electrolyte tetraethylammonium tetrafluoroborate (TEA $BF_4$) in acetonitrile (AN) using carbide-derived carbons (CDCs) with sub-nanometer pores. The capacitance increases can be attributed to the partial or complete desolvation of ions in the sub-nanometer pores. Metal oxides such as $RuO_2$ or $MnO_2$, $MoO_3$, and electronically conducting polymers or their composites, have also been used to increase specific capacitance via pseudo-capacitive redox reactions. Although capacitances of up to 1,300 F/g (e.g., with $MnO_2$) have been reported in aqueous electrolytes, the low electrical conductance, poor compatibility with organic electrolytes, and short cycle life have limited the practical application of these pseudo-capacitive materials. Carbon nanotubes (CNTs), especially single walled CNTs (SWNTs) have an ideal limit SSA of 1,300 $m^2$/g, and can have high electrical conductance along the tubes and can demonstrate good performance in organic electrolyte; however, the high cost for mass production of high quality SWNTs can be a challenge for the commercialization of SWNT-based ultracapacitors.

Graphene has a theoretical SSA of 2,630 $m^2$/g and a very high intrinsic in-plane electrical conductivity, as well as high mechanical strength and chemical stability. Graphene-based materials derived from graphite oxide (GO) can also be manufactured in industrial quantities at relatively low cost. Graphene can be made using any of a variety of known methods. Specific methods for obtaining chemically-modified graphene are also disclosed in Park and Ruoff, "Chemical methods for the production of graphenes," *Nat. Nanotechnol:* 29 (March, 2009), incorporated herein by reference for the purpose of disclosing graphene synthetic methods. In various aspects, graphene can be produced by reducing graphene oxide with a reducing agent. Example reducing agents include anhydrous hydrazine, hydrazine monohydrate, dimethyl hydrazine, sodium borohydride, hydroquinone, alkaline solutions, and alcohols. Hydrogenation/hydrogen transfer techniques employing small molecule reduced species as hydrogen sources and graphene oxide as the hydrogen sink may also be used. Catalysts, such as tris(tripenylphosphine) rhodium chloride can optionally be used as activators of hydrogen that is produced during oxidation of a hydrogen source.

Ultracapacitors based on reduced graphene oxide with capacitance values of approximately 130 F/g in aqueous KOH or 100 F/g in organic electrolytes have been developed. Other graphene-based materials derived from GO can have high end capacitance values of ~200 F/g in aqueous electrolytes, ~120 F/g in organic electrolytes, and ~75 F/g in an ionic liquids. In addition to these materials, high frequency ultracapacitors prepared from oriented graphene grown on nickel surfaces can provide efficient filtering of 120 Hz current with an RC time constant of less than 0.2 ms, but such performance is at the cost of low effective energy storage due to the very low density of the electrode material.

SSA values for the majority of carbon materials derived from GO remain substantially less than 2,630 $m^2$/g. Recently, however, an activation method for processing microwave exfoliated graphite oxide (MEGO) and/or thermally exfoliated graphite oxide (TEGO) was described which achieve SSA values up to about 3,100 $m^2$/g or more. With reference to U.S. patent application Ser. No. 13/782, 329 to Ruoff et al., incorporated by reference herein in its entirety, this aMEGO material exhibits a unique porous structure, commercially acceptable capacitance values, low electrostatic (ESR) values in commercially available ionic liquid and/or organic electrolytes, or a combination thereof.

However, carbon-based electrode materials for ultracapacitors, including thin-walled graphene electrodes, have heretofore exhibited saturation of capacitance at lower than desirable levels. The present disclosure provides, in various aspects, a novel doped carbon material obtained through the chemical activation of microwave exfoliated graphite oxide (MEGO) in the presence of one or more dopants. Doped aMEGO as described herein exhibits or possesses, relative to undoped aMEGO, at least one of: increased gravimetric capacitance, comparable electrical conductivity, increased SSA-normalized capacitance, or a combination thereof. In one aspect of the invention, the doped aMEGO exhibits increased capacitance relative to undoped aMEGO materials independent of any increase in pseudocapacitance associated with the doping.

As described in U.S. patent application Ser. No. 13/782, 329, incorporated by reference above, and with reference to FIG. 1A, aMEGO powder can be prepared by exposing GO to microwave energy. Following irradiation, the MEGO powder can be contacted with an activator, after which, the powder can be filtered and dried. After contacting MEGO with an activator and optionally filtering and drying, the mixture can be subjected to a heat treatment step. In one aspect, the heat treatment step can comprise exposing the mixture to a flowing stream of an inert and/or a reducing gas at elevated temperature for a period of time. FIG. 1B illustrates the microstructure of an exemplary undoped aMEGO material, prepared as described herein. Similarly, FIGS. 1C-1F illustrate exemplary (C) high resolution SEM, (D) annular dark field scanning transmission electron microscopy (ADF-STEM), and (E-F) high-resolution TEM (HR-TEM) images of the microstructure of the undoped a-MEGO material. The images in FIG. 1 illustrate an etched MEGO microstructure with a three-dimensional distribution of mesopores.

According to one aspect of the present disclosure, a doped aMEGO is prepared by further exposing the mixture of MEGO and activator to one or more sources of a desired dopant element or elements during activation of the MEGO material. For example, the mixture of MEGO and activator can be exposed to a flowing stream of a gaseous source of a dopant element during heat treatment of the MEGO and activator. In one aspect, the dopant element is incorporated into the molecular lattice of the aMEGO by such exposure to the dopant element during activation. In one aspect, an aMEGO material doped with one or more non-metal element atoms is provided. Suitable non-metal dopant elements include, without limitation, nitrogen, boron, phosphorus, and silicon. In another aspect, an AMEGO material doped with one or more metal element atoms is provided.

The activator can comprise a basic material, such as, for example, KOH or an aqueous solution thereof, a reducing agent, or one or more other compounds suitable for use in preparing an activated MEGO material, such as zinc chloride, aluminium chloride, magnesium chloride, boric acid, nitric acid, phosphoric acid, potassium hydroxide, sodium hydroxide, or a combination thereof. The heat treatment step can comprise exposing the mixture to a flowing stream of an inert and/or a reducing gas at elevated temperature for a period of time. The gas or mixture of gases can be comprised of argon and other inert and/or reducing gases. The environment (e.g., furnace tube) can be held at atmospheric pressure or a negative pressure for a period of time, for example, about 600 Torr, 500 Torr, 400 Torr, 300 Torr, 200 Torr, 100 Torr, or less. The temperature of the heat treatment step can vary depending on various considerations including the degree of activation desired, the specific materials being processed, and the gases being used. In one aspect, the temperature is a temperature sufficient to at least partially activate the MEGO material. The duration of the heat treatment step can be from about 30 minutes to about 5 hours, for about 0.5, 1, 1.5, 2, 2.5, 3, 3.5, 4, 4.5, 5, or greater than about 5 hours.

In one aspect of the present disclosure, process conditions are selected according to the dopant or dopants, the liquid and/or gaseous source or sources of the dopant element or elements, and the desired degree of doping. For example, increasing the rate of flow of the gaseous source of the dopant element will increase the degree of doping of the aMEGO material. By way of example and not limitation, where aMEGO activation occurs in a 50 mm diameter tube furnace, a flow rate of between 1 sccm and 1000 sccm of a gaseous source of a dopant element will result in doping of the aMEGO material, with increasing flow rates associated with higher degrees of doping. The temperature of the heat treatment step will also affect the degree of doping. For example, increasing the temperature of the heat treatment step, in a range between 600° C. and 900° C., will decrease the degree of doping. The present invention is not intended to be limited to any particular process parameters. One of skill in the art, and in possession of this disclosure, could readily determine appropriate activation conditions for preparation of a doped aMEGO material.

In one aspect, suitable gaseous sources of dopant elements nitrogen are generally those which are subject to decomposition in the conditions suitable for aMEGO activation, including, for example, exposure to basic conditions at high temperatures. Suitable gaseous sources of nitrogen include, by way of example and not limitation, ammonia gas, nitrous acid vapor, nitric acid vapor, ammonia borane vapor, and nitrogen gas. Suitable gaseous sources of boron include, by way of example and not limitation, boron trichloride, boron triflouride, ammonia borane vapor, and boric acid vapor. Suitable gaseous sources of phosphorus include, by way of example and not limitation, phosphorous triflouride and phosphorous acid vapor. Suitable gaseous sources of silicon include, by way of example and not limitation, silane, silicon tetrahalide, trichlorosilan, and hexachlorodisilane.

It was surprisingly discovered that exposure of MEGO during activation to a gaseous source of a dopant element produces a doped aMEGO product. In one aspect, the dopant is incorporated into the aMEGO molecular lattice itself rather than incorporated by surface functionalization. Without limitation to theory, it is believed that under the activation conditions, the dopant atoms actively participate in the rebonding of the aMEGO structure after digestion by the activator. In one aspect, and in accordance with the foregoing, doped aMEGO materials are provided having one or more dopant elements incorporated into the aMEGO molecular lattice.

In further embodiments in accordance with the disclosed subject matter, one or more dopants can be added by contacting microwave-expanded graphite oxide with a liquid source of a dopant during the reduction or the activation of the graphite oxide. By way of example, and not limitation, an aqueous dispersion of graphite oxide can be reduced in a liquid environment containing one or more dopant elements by way of a hydrothermal reduction at a temperature of 130° C. to 180° C. for a period of between about 8 hours and about 12 hours in an autoclave. Additionally or alternatively, a liquid dopant source (of the same or a different dopant element) can be added to an activator such as potassium hydroxide prior to activation. After contacting the reduced graphite oxide with an activator and a liquid dopant source, the mixture can then be subjected to the heat treatment step as previously described.

Liquid dopant elements include the group consisting of a nitrogen-containing liquid, a silicon containing liquid, a boron-containing liquid, a phosphorus containing liquid, and a combination thereof. Examples are nitrous acid, nitric acid, boron trichloride, boron trifluide, ammonia borane, boric acid, silicon tetrahalide, trichlorosilane, hexachlorodisilane, phosphorous acid, phosphorous triflouride, urea, liquid ammonia, amines, citric acid, boric acid, and borane.

The doped AMEGO materials possess surface area similar to that of undoped aMEGO, such as aMEGO prepared under like conditions without exposure to a gaseous source of a dopant element. In one aspect, the doped aMEGO materials exhibit comparable electrostatic resistance to undoped aMEGO prepared under like conditions without exposure to a gaseous source of a dopant element.

In one aspect, aMEGO materials exhibiting a degree of doping of between about 0.001% of the atoms of the aMEGO material to about 50% of the atoms of the aMEGO material is provided. The degree of doping may be about 0.001%, 0.1%, 0.5%, 1%, 2%, 3%, 4%, 5%, 6%, 7%, 8%, 9%, 10%, 15%, 20%, 25%, 30%, 35%, 40%, 45% or 50% or any value in between. The aMEGO material may be doped with one element, two elements, three elements, or more.

In one aspect, the doped aMEGO materials exhibit increased capacitance relative to undoped aMEGO materials. The gravimetric capacitance of the doped aMEGO materials can exceed the gravimetric capacitance of undoped aMEGO materials by, for example, a factor of 1.1, or 1.5, or 2, or 4, or greater. Additionally or alternatively, the area-normalized (SSA) capacitance can exceed that of undoped aMEGO by, for example, a factor of 1.1, or 1.5, or 2, or 4, or ten, or greater.

In one aspect, the doped aMEGO materials provided herein exhibit increased electronic double layer capacitance relative to undoped aMEGO. In one aspect, the doped aMEGO materials described herein exhibit increased capacitance relative to undoped aMEGO materials independent of any increase in pseudocapacitance that results due to doping. Without limitation to theory, it is believed that the improved electronic double layer capacitance is due to the incorporation of the dopant atoms into the molecular lattice of the graphene-based materials during activation. The dopant atoms change the electronic structure of the graphene-based materials and increase the charge carrier density and thus lead to a larger value of the interfacial capacitance.

Doped Monolayer Graphene

Additional research efforts have focused on improving the capacitance of native or "pristine" monolayer graphene. In contrast to various graphene-based materials carbon electrode materials, including graphite oxide-derived graphite oxide materials, monolayer graphene is not structurally or chemically modified during production. Graphene is a single atom thick honeycomb lattice of $sp^2$-bonded carbon atoms. Although, as discussed above, graphene possesses a high SSA and electrical conductivity, its interfacial capacitance is limited. In another aspect of the present disclosure, monolayer graphene in which one or more dopant elements are incorporated into the graphene lattice is provided. Relative to undoped monolayer graphene, the doped graphene provided herein exhibits or possesses greater SSA-normalized capacitance, increased interfacial capacitance, or a combination thereof. In contrast to doped graphene described in the prior art, this increase in capacitance is observed independent of any increase in pseudocapacitance that may result from doping.

In one aspect, the present disclosure provides a method of synthesis of doped monolayer graphene by chemical vapor deposition, in which a metal or dielectric substrate is heated, optionally annealed, and exposed to a gaseous carbon source and a gaseous source or sources of a dopant element or elements.

Figure 2:
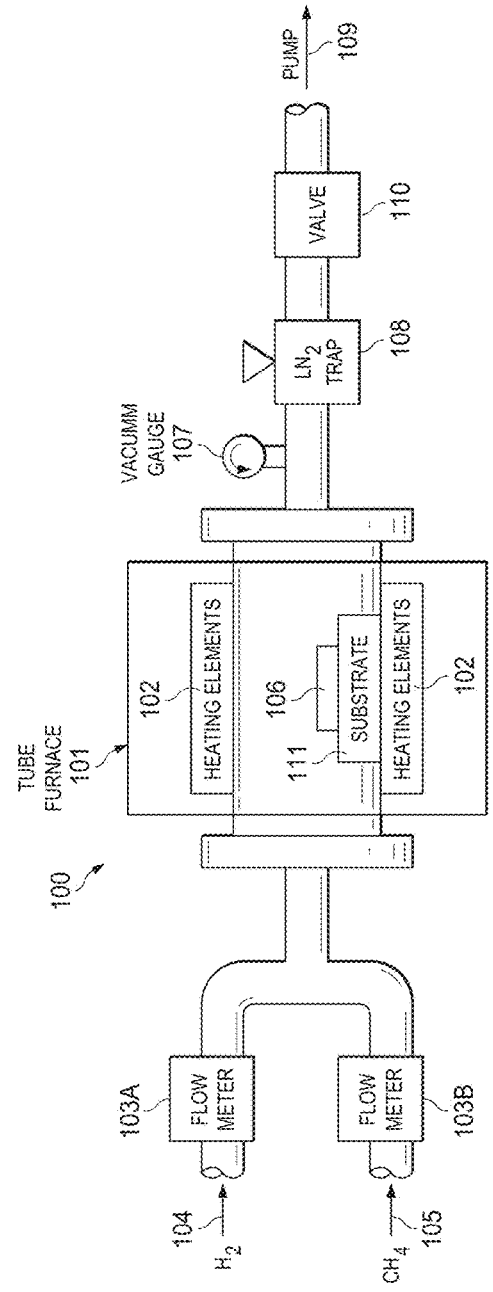
FIG. 2 illustrates an apparatus for synthesizing doped graphene using the processes of the disclosed subject matter according to one aspect of the present disclosure.

FIG. 2 illustrates an exemplary CVD apparatus for synthesizing graphene films using the processes of the present disclosure. Apparatus 100 includes a tube furnace 101, which is an electric heating device used to conduct synthesis of graphene. In one embodiment, tube furnace 101 consists of a cylindrical cavity surrounded by heating elements 102 (e.g., heating coils), which are embedded in a thermally insulating matrix (not shown). In one embodiment, the length of the cylindrical cavity is between 40 to 60 cm with a diameter of about 8 cm. The temperature of tube furnace 101 may be controlled via feedback from a thermocouple (not shown). The growth chamber used to grow graphene can be a furnace as described above that can be scaled to any size as required by the size of the substrate and the size of the graphene to be grown. Alternatively, a cold wall single wafer apparatus can be used to grow graphene which can be heated to an appropriate temperature to react with the reacting gas on the surface of the substrate.

Apparatus 100 may further include flow meters 103A, 103B used to measure the gas flow. For example, flow meter 103A is used to measure the flow of hydrogen ($H_2$) gas 104; whereas, flow meter 103B is used to measure the flow of a gaseous carbon source such as methane 105.

Apparatus 100 may also include a vacuum gauge 107 used to measure the pressure in a vacuum. Additionally, may include a trap 108 used to condense all vapors except the permanent gases into a liquid or solid. Trap 108 prevents vapors from contaminating a vacuum pump 109. In one embodiment, trap 108 uses liquid nitrogen ($LN_2$) as its coolant. Apparatus 100 additionally includes a ball valve 110 used to control the pressure.

Although reference is made above to one exemplary CVD apparatus, the present disclosure is not limited to a particular apparatus or system for CVD processes. The principles of the present disclosure may be implemented by any means for CVD, including, without limitation, heating the substrate surface using rapid thermal processing or flash annealing or by use of a cold wall chamber, as understood by persons of ordinary skill in the art in light of the present disclosure. Additionally, while reference is made to specific parameters, including dimensions of the CVD apparatus and substrate, the present disclosure is not limited to these parameters, but rather extends to all parameters and dimensions practicable according to the principles of the present disclosure.

Figure 3:
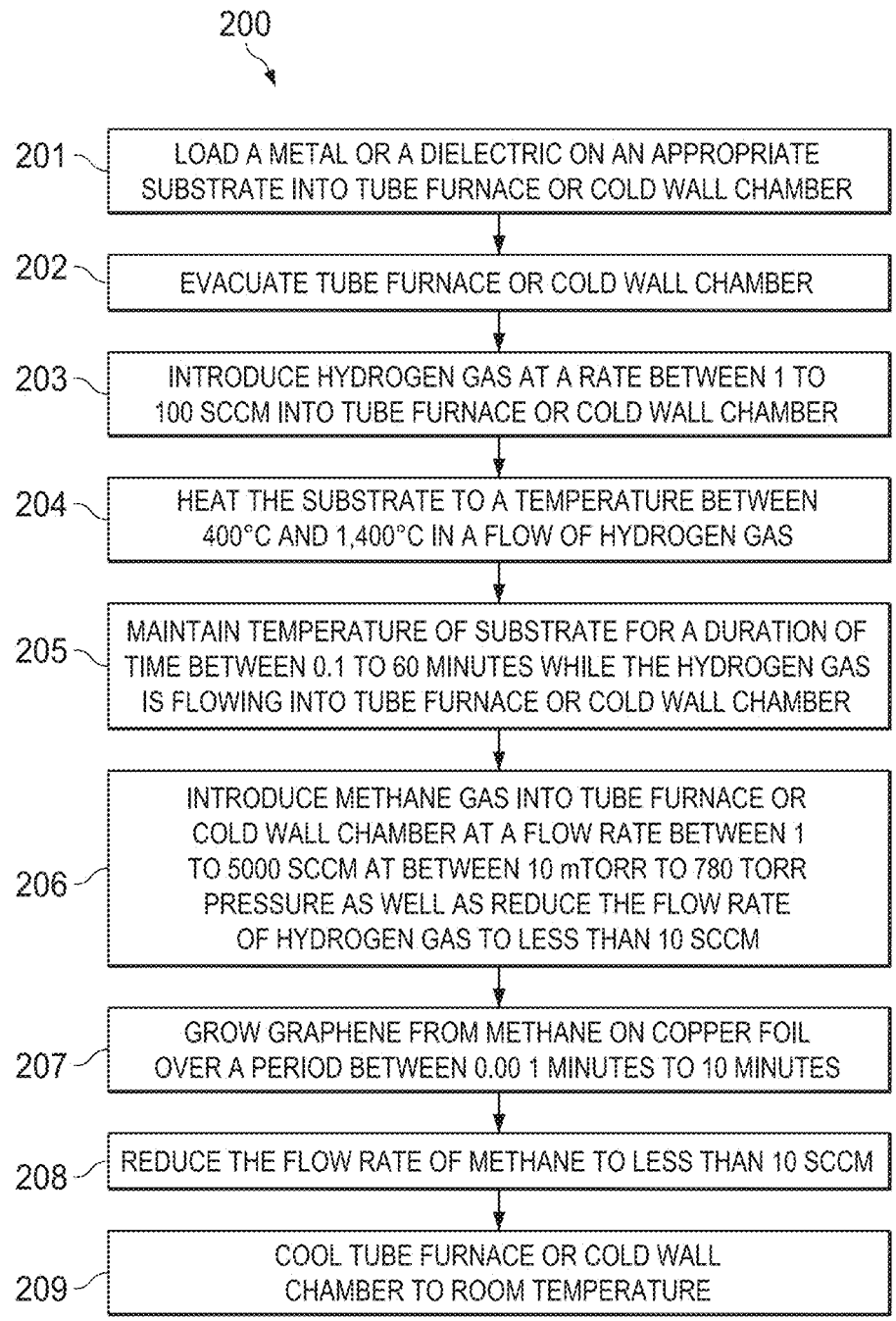
FIG. 3 is a flowchart of a prior art method of undoped graphene synthesis by chemical vapor deposition.

With reference to U.S. Pat. No. 8,470,400, hereby incorporated by reference in its entirety, CVD techniques have been employed to grow graphene films on metal substrates. FIG. 3 depicts an exemplary flowchart of a prior art method of CVD synthesis of graphene films. As depicted, in step 201, a metal substrate (e.g., foil of copper 106) or a dielectric on an appropriate substrate is loaded into tube furnace 101 or into a cold wall chamber. In step 202, tube furnace 101 or the cold wall chamber is evacuated. In step 203, a rate of hydrogen gas 104 between 1 to 100 sccm is introduced into tube furnace 101 or the cold wall chamber. In step 204, the substrate is heated to a temperature between 400° C. and 1,400° C. in a flow of hydrogen gas 104. In step 205, the temperature of the substrate in step 204 is maintained for a duration of time between 0.1 to 60 minutes while the hydrogen gas 104 is flowing into tube furnace 101 or the cold wall chamber. In step 206, methane 105 or some other organic compound is introduced into tube furnace 101 or the cold wall chamber at a flow rate between 1 to 5,000 sccm at between 10 mTorr to 780 Torr of pressure. Furthermore, in step 206, the flow rate of hydrogen gas 104 is reduced to less than 10 sccm. In step 207, graphene is grown from methane 105 on copper foil 106 over a period between 0.001 minutes to 1000 minutes. In step 208, the flow rate of methane 105 is reduced to less than 10 sccm. In step 209, tube furnace 101 or the cold wall chamber is cooled to room temperature. Any modification to the techniques disclosed above, including, for example, those described in U.S. patent application Ser. No. 13/967,129, are suitable for use with the present disclosure.

It has surprisingly been found that additionally introducing one or more gaseous sources of a dopant element during chemical vapor deposition synthesis of graphene results in doped graphene monolayers. In one aspect, the prior art method of graphene synthesis is modified by providing an additional step concomitant with the graphene synthesis step wherein a gaseous source of a dopant element during graphene synthesis. The gaseous source(s) of the dopant element(s) is/are introduced after graphene synthesis is initiated by introduction of a gaseous carbon source. The doping step may be included at any point after initiation of graphene synthesis, and may have a duration less than or equal to the duration of the graphene synthesis step. In one aspect, the doping step has a duration less than the duration of the graphene synthesis step. The gaseous source(s) of the dopant(s) may be provided concomitantly with the gaseous carbon source or flow of the gaseous carbon source may temporarily be suspended while the graphene is doped. Periodic concomitant or alternating introduction of the gaseous source of the dopant is also suitable according to one aspect of the present disclosure.

In one aspect, dopant elements include non-metal elements. Suitable non-metal elements include nitrogen, phosphorus, boron, and silicon. Suitable gaseous sources of nitrogen include, by way of example and not limitation, ammonia gas, nitrous acid vapor, nitric acid vapor, ammonia borane vapor, nitrogen gas. Suitable gaseous sources of boron include, by way of example and not limitation, boron trichloride, boron triflouride, ammonia borane vapor, boric acid vapor Suitable gaseous sources of phosphorus include, by way of example and not limitation, phosphorous triflouride, phosphorous acid. Suitable gaseous sources of silicon include, by way of example and not limitation, silane, silicon tetrahalide, trichlorosilan, hexachlorodisilane.

The precise process parameters will vary according to the dimensions of the CVD apparatus, the gaseous sources of carbon and dopant elements, and the desired degree of doping. An increased ratio of the partial pressure of the gaseous source(s) of the dopant element(s) relative to the gaseous source of carbon during the doping step will result in an increased degree of doping. The doping level can be in the range of 0 to 3% by this technique. The estimated level of doping in NG1 and NG2 is 1.3 at % and 1.8 at %, respectively.

Without limitation by theory, and with reference to "Nitrogen doping of graphene and its effect on quantum capacitance, and a new insight on the enhanced capacitance of N-doped carbon" by Zhang et al., *Energy & Environmental Science,* 2012, 5:9618, hereby incorporated by reference in its entirety, it is believed that the total capacitance of high surface area ultracapacitor electrodes including graphene and aMEGO is limited by the quantum capacitance of the graphene and graphene-based materials. In one aspect of the present disclosure, greater quantum capacitance is observed in doped graphene relative to undoped graphene. Increased bulk capacitance and quantum capacitance are observed with increasing dopant concentration. It is further believed that doping of graphene-based materials has a similar effect on quantum capacitance, which accounts for the improved capacitance observed in the doped aMEGO materials discussed herein.

Unlike prior art descriptions of carbon electrode doping, according to one aspect of the present disclosure, the dopant or dopants are incorporated into the planar graphene or graphene-based carbon lattice. Dopant incorporation in this manner primarily affects the density of the electronic states of the electrode material to influence the quantum capacitance of the material. Prior art doping techniques, in contrast, primarily involve functionalization of the surface of the graphene or graphene-based lattice. Doping in this manner primarily affects the pseudocapacitance of the material. The main advantage of capacitance improvement by the electrical double layer (EDL) mechanism relative to the pseudocapacitive mechanism is the better stability and the wider application in various types of electrolytes of the EDL, such as in aqueous electrolyte, organic electrolyte and ionic liquid. Pseudocapacitance includes faradic reactions with electron charge transfer between electrode and electrolyte and is inherently slower than EDL capacitance.

Use of Doped aMEGO and Doped Graphene in Electrodes and Supercapacitors

In various aspects, the inventive a-MEGO material can be utilized as a component of an electrode, for example, in a supercapacitor. Supercapacitor designs and electrode designs for use in supercapacitors are known, and one of skill in the art could readily select an appropriate supercapacitor, electrode, and/or cell design for use with the compositions and methods of the present invention. In a supercapacitor, a voltage potential can be applied across the electrodes of the supercapacitor, such that one electrode becomes positively charged and the other becomes negatively charged. Negatively charged ions in the electrolyte cover the surfaces of the positively charged electrode, while positively charged ions in the electrolyte cover the surfaces of the negatively charged electrode, a result of the aforementioned electrostatic interactions.

In one aspect, a supercapacitor comprises one or more graphene-based electrodes, an electrolyte, and a dielectric separator that can divide the supercapacitor into two chambers, wherein each of the two chambers comprises an electrode and a portion of electrolyte. In another aspect, the electrolyte is an ionic liquid and/or comprises an ionic liquid.

In one aspect, at least one electrode of a cell comprises a doped graphene-based aMEGO material, that is compatible with the electrolyte. In a specific aspect, one or more electrodes can be made of doped aMEGO as described herein.

In another aspect, at least one electrode comprises doped aMEGO which was produced by exposing a graphite-oxide derived carbon to microwave radiation and subsequently chemically activating the carbon to further reduce it, for example using 1-10 M KOH at a temperature of from about 200° C. to about 1,000° C. for one several hours in the presence of a flowing gaseous source of a dopant element.

The superior capacitance of doped aMEGO materials opens the possibility to engineer supercapacitor electrodes based on doped aMEGO materials to target a wide range of applications such as high energy, high power, or low cost. Unlike other carbons, no special substrates or transfer procedures are required for synthesis of the doped aMEGO materials. In one aspect, electrodes can be the same thickness used in commercial cells and testing can be performed using commercial collectors, separators, binders, and electrolytes. In addition, the methods to prepare doped aMEGO materials can be easily scaled to industrial levels. For example, the inventive methods described herein can be applied to TEGO, which is currently manufactured in ton quantities.

In other aspects, the doped aMEGO material can be stable, for example, when used in an electrochemical cell and/or a supercapacitor. In various aspects, the doped aMEGO material can be stable for a number of charge/discharge cycles, for example, up to about 200,000, 500,000, or 1,000,000 cycles. In other aspects, the doped aMEGO can be stable over a range of temperatures that can be encountered during operation of a supercapacitor, for example, from about −20° C. to about 300° C., including all ranges and subranges therebetween.

The doped aMEGO materials described herein, together with the methods to prepare doped aMEGO materials can also be useful hydrogen storage applications, gas adsorption applications, adsorption of analytes from liquid and/or gaseous samples, as catalyst supports for fuel cells, and/or as supports for Li-ion particles or other nanoparticles (e.g., Si and/or Sn particles for battery anodes, $MnO_2$ particles for hybrid ultracapacitors), or a combination thereof. In one aspect, the doped aMEGO material is disposed in an electrode of a supercapacitor. In another aspect, the doped aMEGO material is disposed in a fuel cell electrode as a catalyst support. In yet another aspect, the doped aMEGO material is disposed in an electrode of a lithium ion battery. In still other aspects, the doped aMEGO material can be disposed in an electrode of an energy storage and/or conversion device, or in an analyzer as an adsorption media. The doped monolayer graphene sheets described herein are suitable for similar applications.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Example 1. Synthesis and Characterization of Doped aMEGO Materials

Undoped microwave exfoliated graphite oxide prepared from graphite oxide by microwave exfoliation was dispersed and soaked in aqueous potassium hydroxide for 20 hours as described in U.S. patent application Ser. No. 13/782,329, hereby incorporated by reference in its entirety. Activation was performed at 700° C. or 800° C. for 1 hour in a horizontal tube furnace with a 50 mm diameter with an argon flow of 120 sccm at a pressure of one atmosphere. The sample was allowed to cool for several hours, removed from the furnace and repeatedly washed with deionized water until a pH value of 7 was reached. The final undoped aMEGO was obtained after drying at 80° C. for 24 hours.

Doped aMEGO was prepared according to the protocol above, with an additional flow of nitrogen gas during the activation process. The amount of nitrogen doping was controlled by varying the flow rate of ammonia gas during activation. As discussed below, flow rates of 20 sccm, 30 sccm and 40 sccm of ammonia gas yielded nitrogen-doped aMEGO with doping of 0.7 percent of atoms (at %), 1.0 at %, and 2.3 at % respectively.

The pore structure of the doped aMEGO samples was investigated using physical adsorption of nitrogen at the liquid nitrogen temperature (77 Kelvin) on an automatic volumetric sorption analyzer (NOVA2000, Quantachrome). Prior to measurement, each sample was vacuum-degassed at room temperature for 5 hours. The specific surface area was determined according to the Brunauer-Emmett-Teller method in the relative pressure range of 0.05-0.2. Scanning electron microscopy was conducted at 30 kV accelerating voltage (Quanta 600 FEG, FEI Company). X-ray photoelectron spectra (XPS) were collected using a monochromatic Al K X-ray source and Omicron EA125 hemispherical analyzer. The spectrometer was configured with an acceptance angle of +/−8°, a takeoff angle of 45°, and a 15 eV analyzer pass energy, operated in the constant analyzer energy (CAE) mode.

Both three-electrode and two-electrode cell configurations were used to measure the performance of N-doped aMEGO and undoped aMEGO as a supercapacitor electrode. For a three-electrode cell setup, a slurry containing polytetrafluoroethylene (PTFE; Aldrich; 60 wt % dispersion in water) and aMEGO (aMEGO:PTFE 95:5 in weight) was pressed onto a nickel foam (1 cm×1 cm) and dried at 100° C. under vacuum to use as the working electrode. The three-electrode cell consisted of a Pt sheet and saturated calomel electrode as the counter and reference electrodes, respectively.

For a two-electrode cell configuration, PTFE was added to the aMEGO powder (aMEGO:PTFE 95:5 in weight) as a binder. The aMEGO powder was mixed into a paste using a mortar and pestle, rolled into sheets of uniform thickness ranging from 30 to 50 μm thick (from sheet to sheet) and punched into 0.5 inch diameter electrodes after drying at 100° C. under vacuum. Two nearly identical (by weight and size) electrodes were assembled in a test cell consisting of two current collectors, two electrodes, and an ion-porous separator (Celgard® 3501) supported in a test fixture consisting of two stainless steel plates. 1M TEABF4 in acetonitrile, and 6 M potassium hydroxide, solutions were used as the electrolytes in separate experiments.

Gravimetric capacitance for a single electrode was calculated from the discharge curve in a two-cell electrode as $$C_{single} = \frac{4I\Delta t}{m\Delta V}$$

where I is the constant current and m is the total mass for both carbon electrodes, Δt is the discharge time and ΔV is the voltage change during the discharge process.

Gravimetric capacitance in a three-electrode cell was obtained as $$C_{single} = \frac{I\Delta t}{m_s \Delta V}$$

where I is the constant current and $m_s$ is the mass of the working electrode, Δt is the discharge time and ΔV is the voltage change during the discharge process.

The surface area normalized capacitance $C_{SA}$ (μF cm$^{-2}$) was estimated from:

$$C_{SA} = \frac{C_{single}}{S_{BET}} \times 100$$

where $S_{BET}$ is the specific surface area (m2 g-1) derived from the $N_2$ adsorption and $C_{single}$ is the gravimetric capacitance in F g$^{-1}$.

Characterizing data for the doped aMEGO materials is provided in FIG. 4. FIG. 4A shows the nitrogen adsorption/desorption isotherms of the doped aMEGO materials. As illustrated, the pore size and distribution of the N-doped aMEGOs are very similar as those of the undoped aMEGO. The parameters describing the porosity of the doped and undoped aMEGO materials are provided in Table 1 below.

TABLE 1 aMEGO Synthesis and Surface Area

| Sample | Activation Temperature (° C.) | BET Surface Area (m²/g) | Nitrogen at % | Flow Rate of Ammonia Gas During Activation (sccm) |
|---|---|---|---|---|
| aMEGO700 | 700 | 2300 | 0 | 0 |
| N-aMEGO-1 | 700 | 2490 | 0.7 | 20 |
| N-aMEGO-2 | 700 | 2512 | 1 | 30 |
| N-aMEGO-3 | 700 | 1929 | 2.3 | 40 |
| aMEGO800 | 800 | 2763 | 0 | 0 |
| N-aMEGO800 | 800 | 2226 | 0.8 | 20 |

Figure 4B:
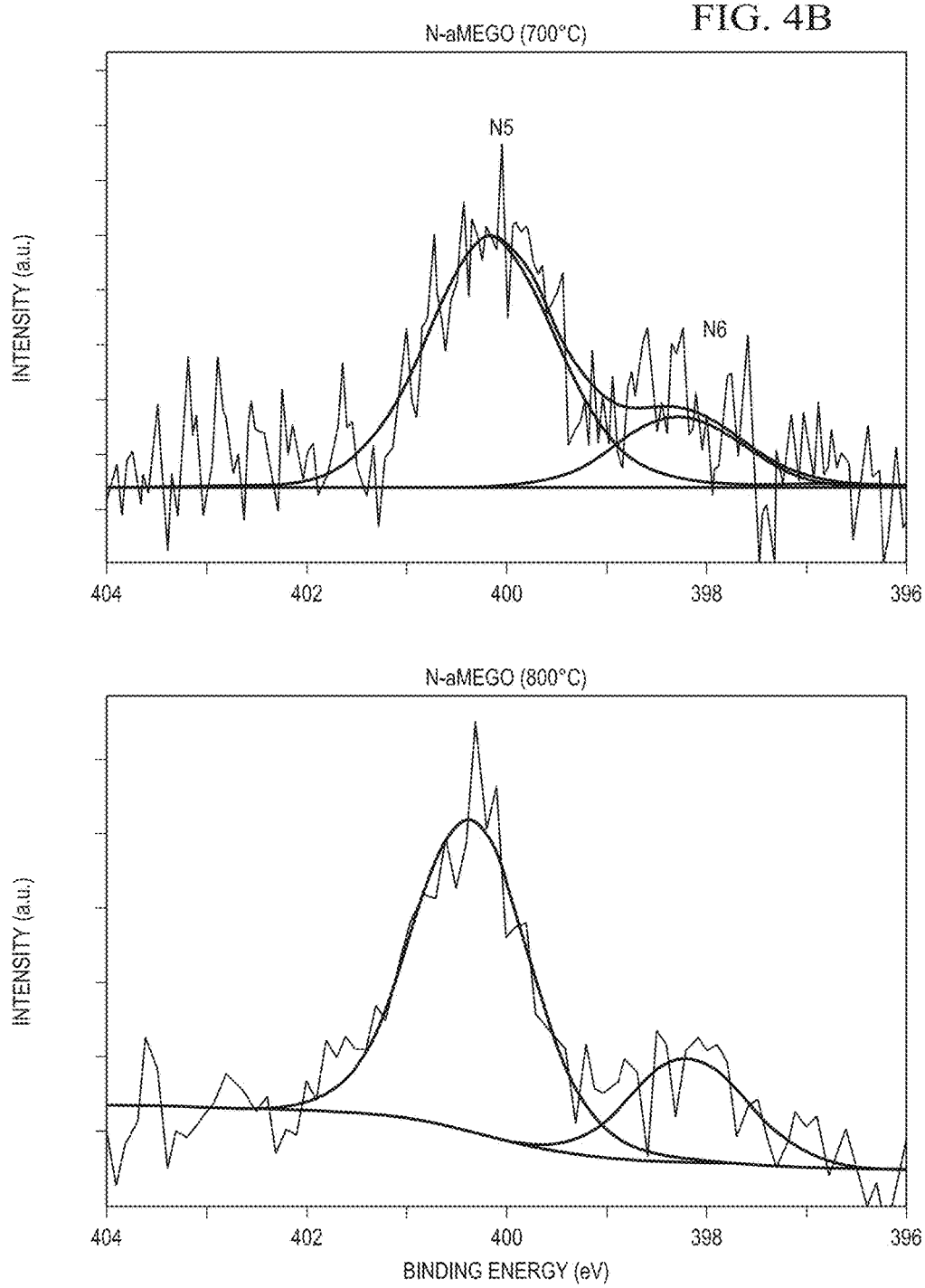
FIG. 4B X-ray photoelectron spectra for doped aMEGO at different activation temperatures.

By maintaining essentially the same porous structure for all samples, the observed variances in capacitance can be attributed to the dopant. X-ray photoelectron spectroscopy (XPS) analysis as shown in FIG. 4B confirmed the presence of nitrogen atoms in place of carbon atoms in the aMEGO. Two types of nitrogen dopants were observed, pyridinic nitrogen (N6) and pyrrolic nitrogen (N5).

Figure 5A:
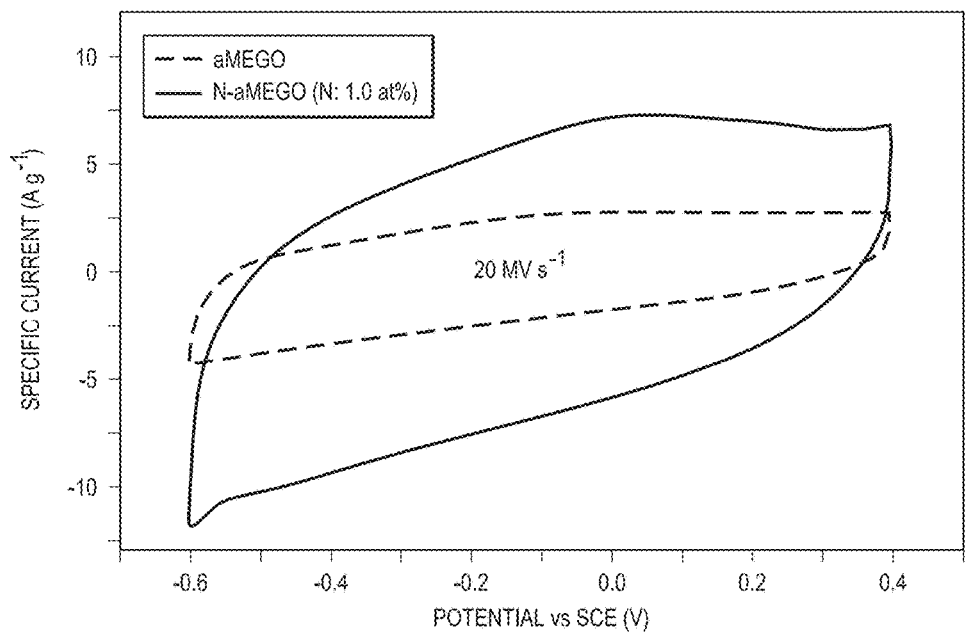
FIG. 5A is cyclic voltammetry curves of aMEGO and N-doped aMEGO at a scan rate of 20 mVs$^{-1}$.
Figure 5B:
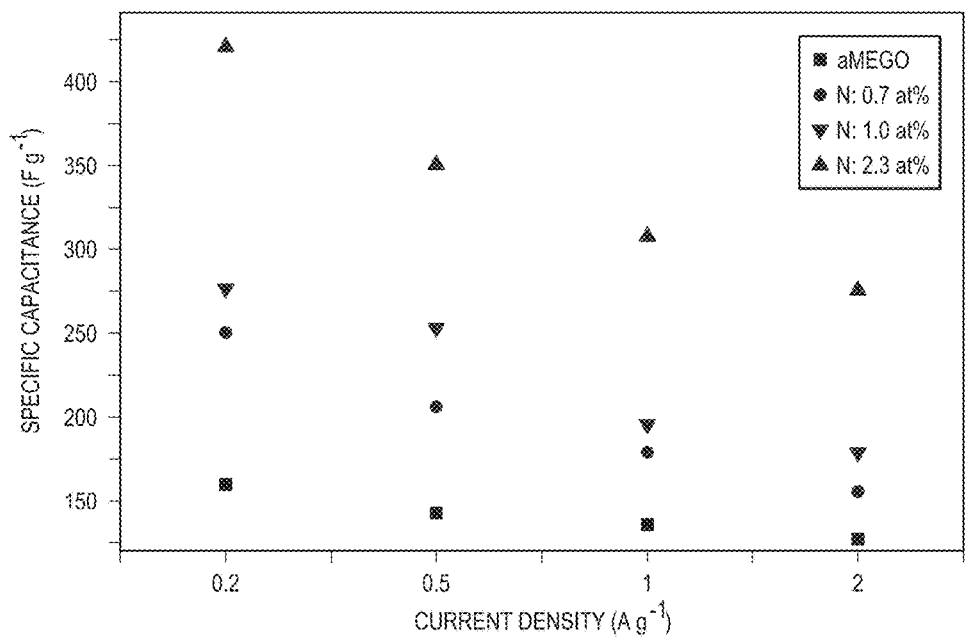
FIG. 5B is gravimetric capacitance of doped and undoped aMEGO materials at varying current densities.

The effects of N dopants on capacitance was evaluated by conducting cyclic voltammetry (CV) and galvanostatic charge/discharge using a three-electrode electrochemical cell in 6 M KOH electrolyte with Pt sheet and saturated calomel electrode as the counter and reference electrodes, respectively. FIG. 5 illustrates the electrochemical performance of the doped aMEGO electrodes. As illustrated in FIG. 5A, At a scan rate of 20 mVs$^{-1}$, a cell with an N-doped aMEGO electrode with 1.0 at % nitrogen had much larger current than an electrode of pure aMEGO, indicating a greatly increased capacitance due to nitrogen doping. The rate dependent gravimetric capacitance for the aMEGO electrodes activated at 700° C. with three nitrogen dopant concentrations are illustrated in FIG. 5B; as shown, the gravimetric capacitance increases with increased dopant concentration, with the highest gravimetric capacitance observed being approximately 420 F g$^{-1}$.

Figure 5C:
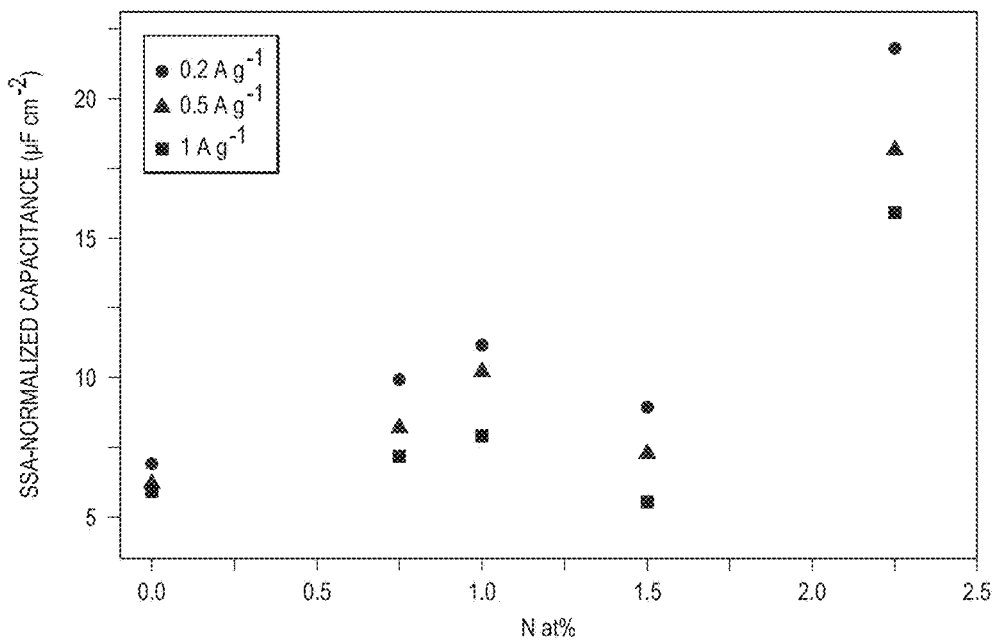
FIG. 5C is specific surface area (SSA)-normalized capacitance as a function of nitrogen dopant concentration of the aMEGO materials at various current densities.
Figure 5D:
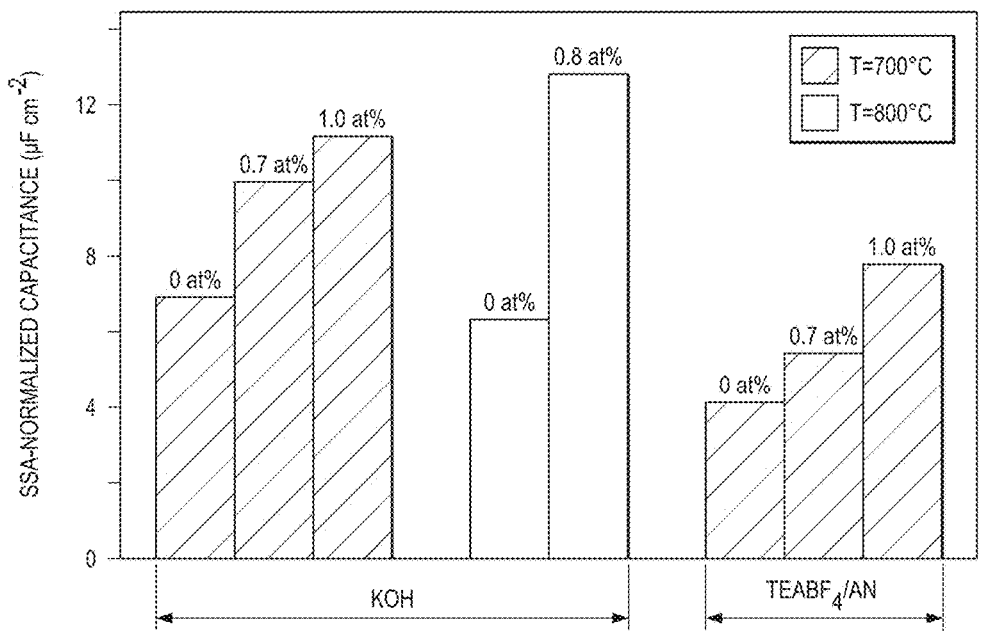
FIG. 5D the SSA-normalized capacitance at various nitrogen concentrations for samples tested in 6 M KOH using a three-electrode setup and 1 M TEABF$_4$/acetonitrile using a two-electrode cell configuration.

As illustrated in FIG. 5C, at a current density of 0.2 A/g, the area normalized capacitance increased from 6 g cm-2 to 11 and 22 for nitrogen-doping levels of 0, 1.0 at % and 2.3 at % respectively. As shown in FIG. 5D, similar capacitance enhancement was seen on nitrogen-doped aMEGO that was produced at 800° C. As the micro-porosity of the undoped and doped aMEGO materials is similar, the main parameter affecting the specific capacitance of the materials is the extend and type of nitrogen doping.

To further establish the effect of aMEGO doping, a two-electrode symmetrical supercapacitor cell was constructed using nitrogen-doped aMEGO as the electrodes and an aprotic electrolyte, 1 M TEABF4 in acetonitrile or, in separate experiments, an aqueous electrolyte, aqueous 6 M potassium hydroxide. As shown in FIG. 5D the two electrode cell exhibited similar capacitance enhancements for nitrogen-doped aMEGO electrodes when tested in aqueous and aprotic electrolytes.

Figure 6A:
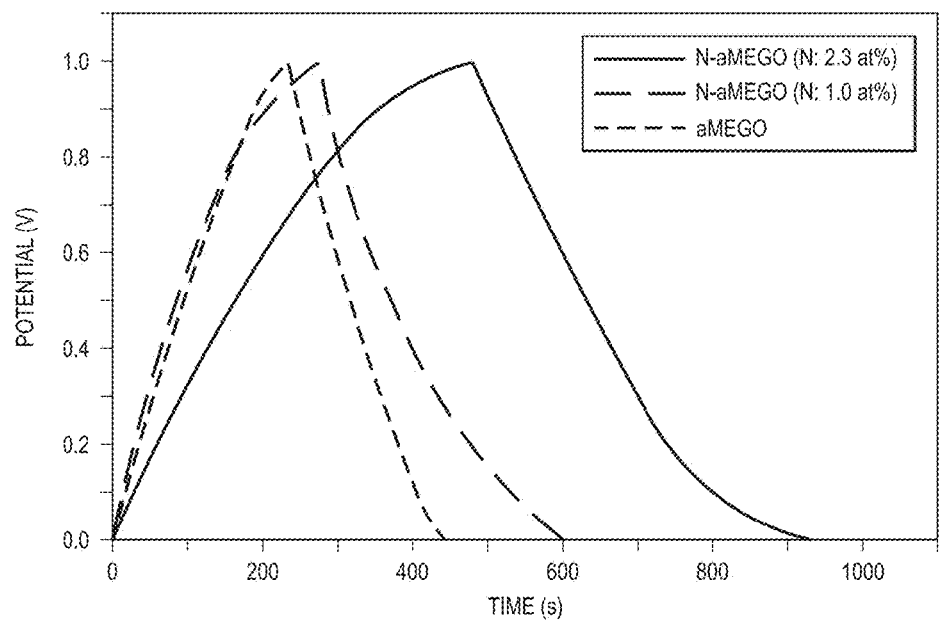
FIG. 6A is a Nyquist plot of complex-plane impedance for doped and undoped aMEGO materials in 6 M KOH electrolyte using a three-electrode configuration.
Figure 6B:
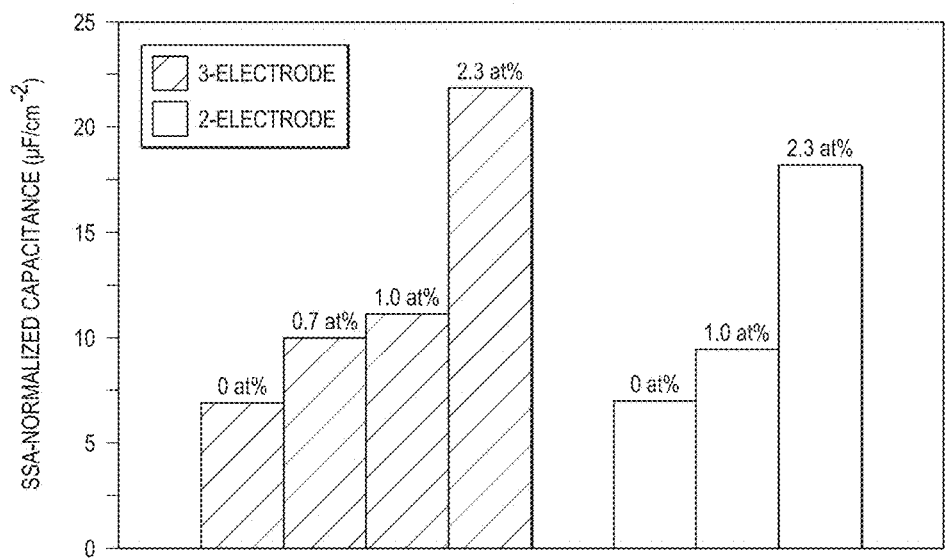
FIG. 6B is a Nyquist plot of complex plane impedance for doped and undoped aMEGO materials in 1 M TEABF$_4$/acetonitrile using a two-electrode cell configuration.
Figure 7A:
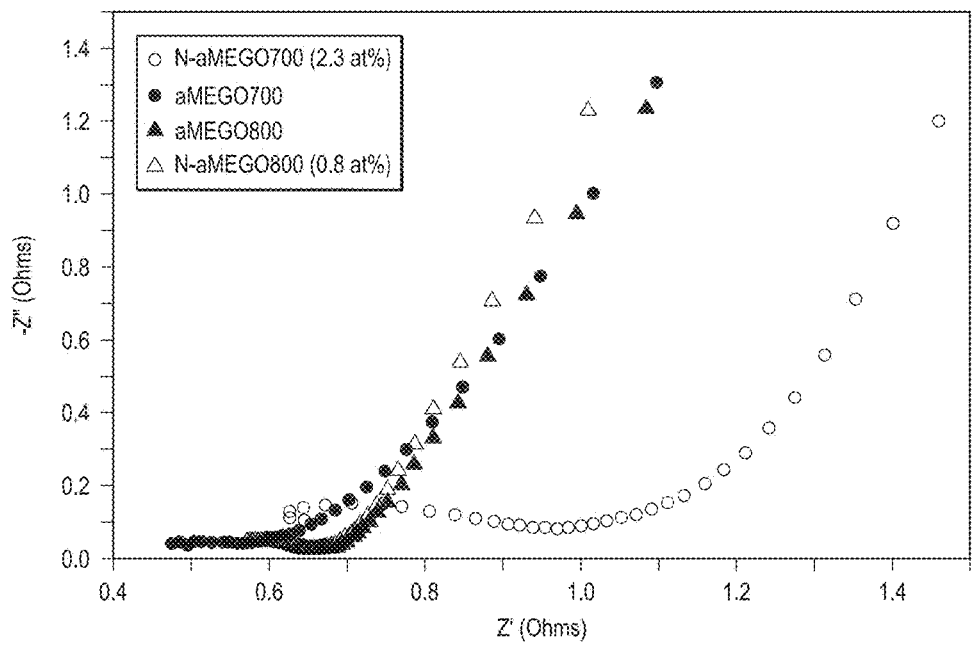
FIG. 7A is charge-discharge curves at a current density of 0.2 A/g for doped and unposed aMEGO materials in 6M KOH electrolyte using a two-electrode configuration.
Figure 7B:
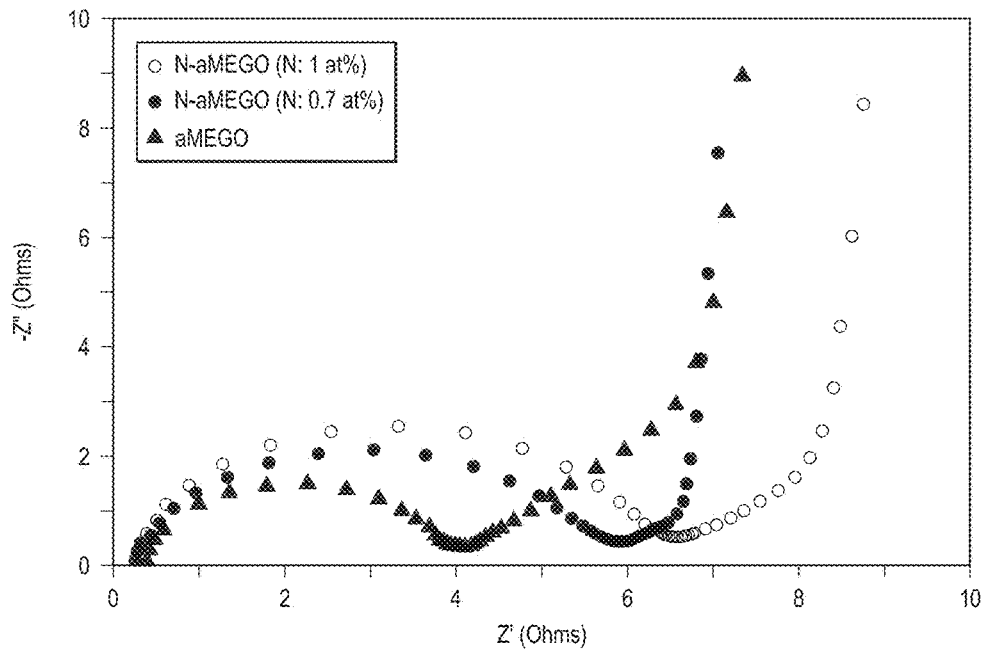
FIG. 7B is SSA-normalized capacitance of undoped and doped aMEGO materials with varying concentration of dopant for samples tested in 6 M electrolyte using a three-electrode and a two-electrode setup.

FIG. 6A illustrates the dopant concentration-dependant increase in SSA-normalized capacitance in both 3-electrode cells and 2-electrode cells. With light nitrogen doping, the electrical conductivity of the doped aMEGO electrodes did not significantly decrease, as indicated by the small increase of equivalent series resistance (ESR) from the electrochemical impedance analysis shown in FIG. 6B. The ESR for the doped aMEGO with a dopant concentration of 2.3 at % increased only approximately 0.5 ohms compared to that of the pure aMEGO electrode. FIGS. 7A and 7B illustrates the charge-discharge curves for doped and undoped aMEGO materials in 6 M KOH using a two electrode configuration.

Example 2. Synthesis and Characterization of Doped Monolayer Graphene

Undoped and doped monolayer graphene domains were prepared by chemical vapor deposition on copper foils. The copper foils (99.8% copper, Alfa-Aesar, item no. 13382) were cut into 2 cm×10 cm strips and loaded at the center of a hot wall tube furnace consisting of a 22 mm diameter fused quartz tube heated in a split furnace (TF55035A-1, Linderburg/Blue M). The tube was evacuated, and then filled with 2 sccm hydrogen (99.999%, Airgas). The furnace was heated to 1035° C. under flowing hydrogen at a pressure of 20 mTorr. The Cu foil was then annealed for 30 minutes before introducing carbon precursors. Methane (99.999%, Airgas) and pyridine (>99.0%, Aldrich) mixtures at different partial pressures were introduced at 1035° C. for 7 minutes in order to obtain graphene with different nitrogen doping levels. The total pressure for graphene growth was maintained at 70 mTorr as shown in Table 2. The furnace was then cooled to room temperature. The doped graphene exhibited no discernable structural differences from undoped graphene.

TABLE 2

Undoped and Doped Graphene Synthesis Conditions

| Sample | Hydrogen (mTorr) | Methane (mTorr) | Pyrridine (mTorr) | Total (mTorr) | Nitrogen Doping (at %) |
|---|---|---|---|---|---|
| Undoped (PG) | 20 | 50 | 0 | 70 | 0 |
| Doped (NG1) | 20 | 35 | 30 | 70 | 1.3 |
| Doped (NG2) | 20 | 0 | 50 | 70 | 1.8 |

Raman spectroscopy was performed to determine the number of layers, structure, doping and impurity levels of the graphene samples. The Raman spectra of the graphene on silicon dioxide were measured by a WITEC Alpha300 system with a 532 nm laser excitation source. X-ray photoelectron spectra (XPS) were collected using a monochromatic A1 K X-ray source and Omicron EA125 hemispherical analyzer. The spectrometer was configured with an acceptance angle of +/−8°, a takeoff angle of 45°, and a 15 eV analyzer pass energy, operated in the constant analyzer energy (CAE) mode.

The interfacial capacitance of the undoped (PG) and doped (NG) monolayer graphene samples was measured in a three-electrode cell using an Eco Chemie Autolab PGSTAT100 potentiostat equipped with the FDA2 frequency response analyzer module and Nova 1.5 software. Pt wire and Ag/AgCl were used as the counter and reference electrodes, respectively. 6 M potassium hydroxide, a high concentration aqueous electrolyte was used to minimize the effect of the diffuse-layer capacitance. The graphene working electrode was formed by covering one side of the CVD grown graphene on a copper foil substrate first with thin PMMA and then insulating tape. The copper substrate was then removed from the graphene in a bath of ammonium persulfate (0.5 M). A small portion of the copper at the edges of the sample that is not immersed into the ammonium persulfate solution is protected from the etching and serves as the metal contact. This procedure leaves the graphene electrode relatively free of residue.

Cyclic voltammograms were performed to detect any non-EDL behavior of the electrodes that would indicate the presence of impurities or faradaic activity (i.e. pseudocapacitance). Non-EDL behavior was not detected. The interfacial capacitance was determined using electrical impedance spectroscopy (EIS) with a sinusoidal signal with an amplitude of 10 mV over a frequency range of 100 kHz to 1 Hz. The capacitance values at each potential were determined by fitting the EIS spectra to an R(RC) equivalent circuit using Nova 1.5 software (Eco Chemie) with error less than 1%. The area-normalized capacitance is the capacitance divided by the graphene surface area exposed to the electrolyte.

The Raman spectra illustrating the micro-Raman characteristics of undoped (PG) and doped (NG) graphene are shown in FIG. 8. FIG. 8A shows maps of the G peak over a large area for PG and NG, respectively. FIG. 8B shows an optimal micrograph image of an NG sample and indicates a clean surface. The XPS data shown in FIG. 8C confirm the presence of nitrogen dopants, and indicates that two types of nitrogen dopants are present in the NG samples—pyrridinic nitrogen (N6) and pyrrolic nitrogen (N5). The nitrogen doping of the graphene samples therefore resembles the nitrogen doping of aMEGO.

Figure 8A:
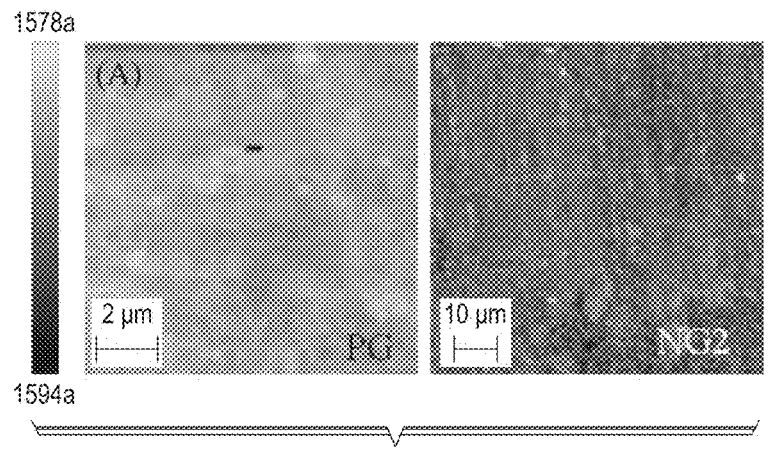
FIG. 8A is Raman spectra maps of G peak position for undoped (PG) and doped (NG2) graphene after transfer to a Si02/Si substrate.
Figure 8B:
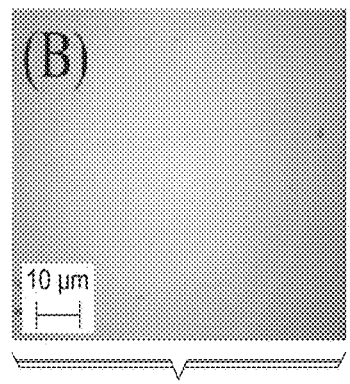
FIG. 8B is an optical micrograph of NG2.
Figure 8E:
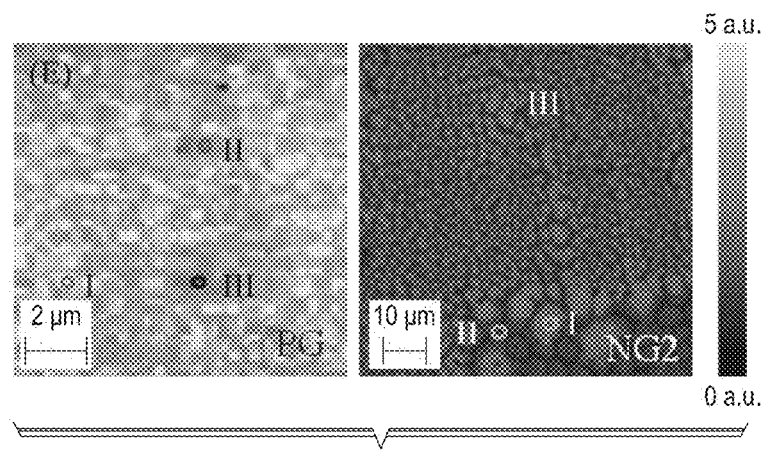
FIG. 8E is Raman mapping of the ratio of the 2D/G peak intensities for PG and NG2 at the same position as shown in FIG. 8A.
Figure 8C:
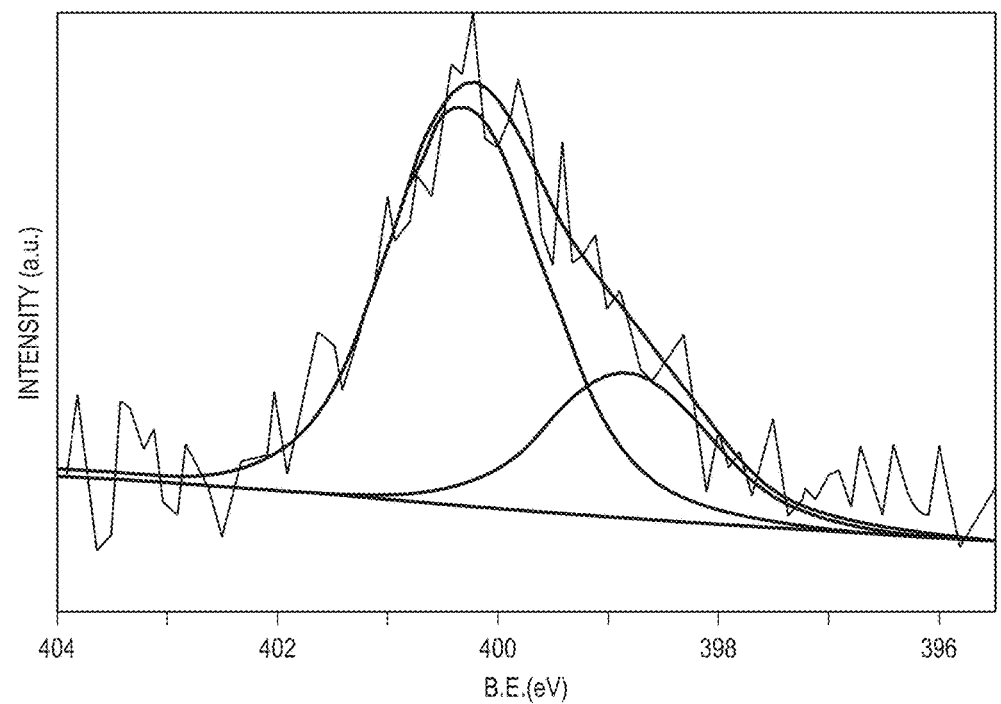
FIG. 8C is XPS N 1s spectrum of NG2.
Figure 8D:
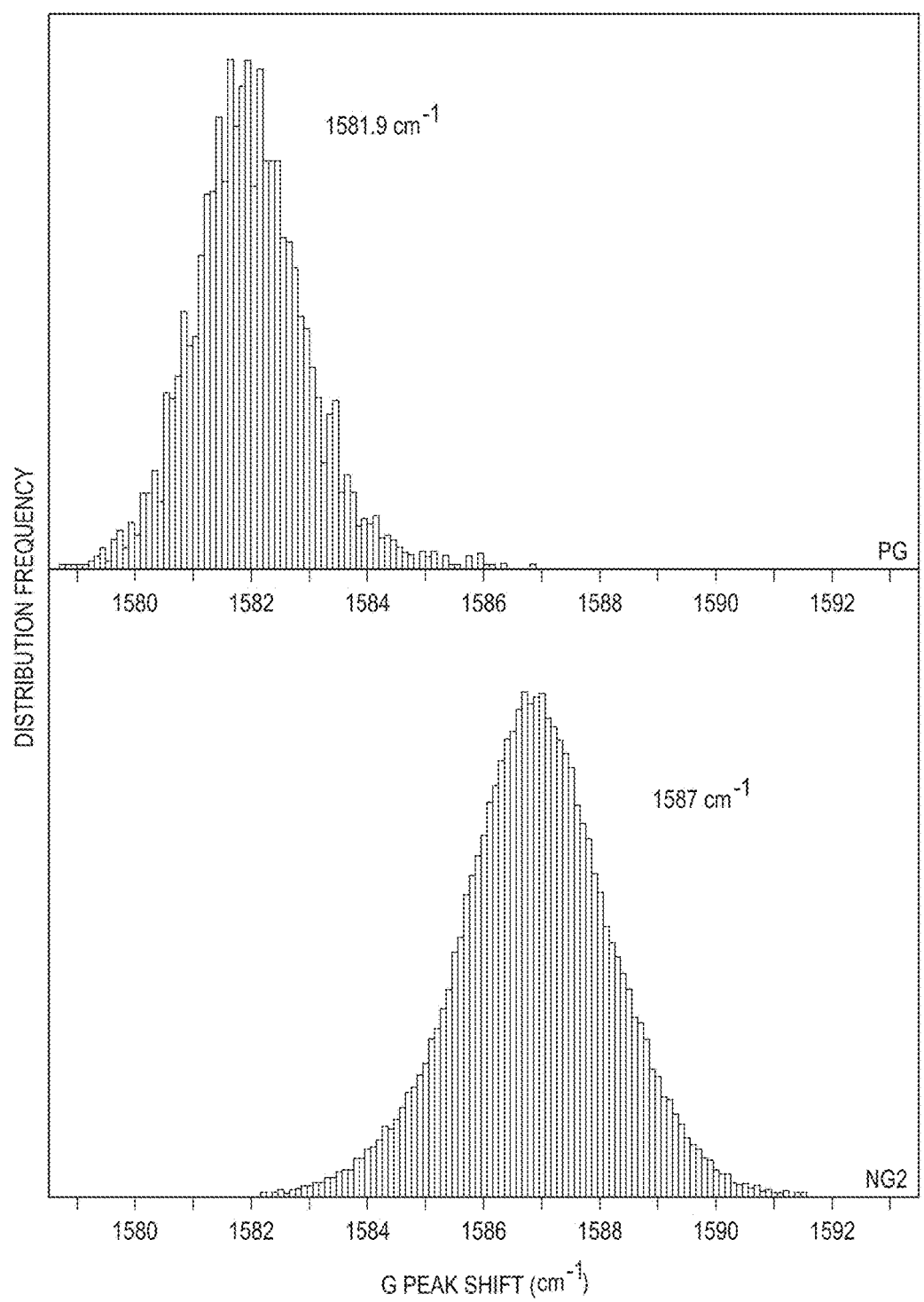
FIG. 8D histograms of the G peak positions of PG and NG2 from the maps in FIG. 8A.
Figure 8F:
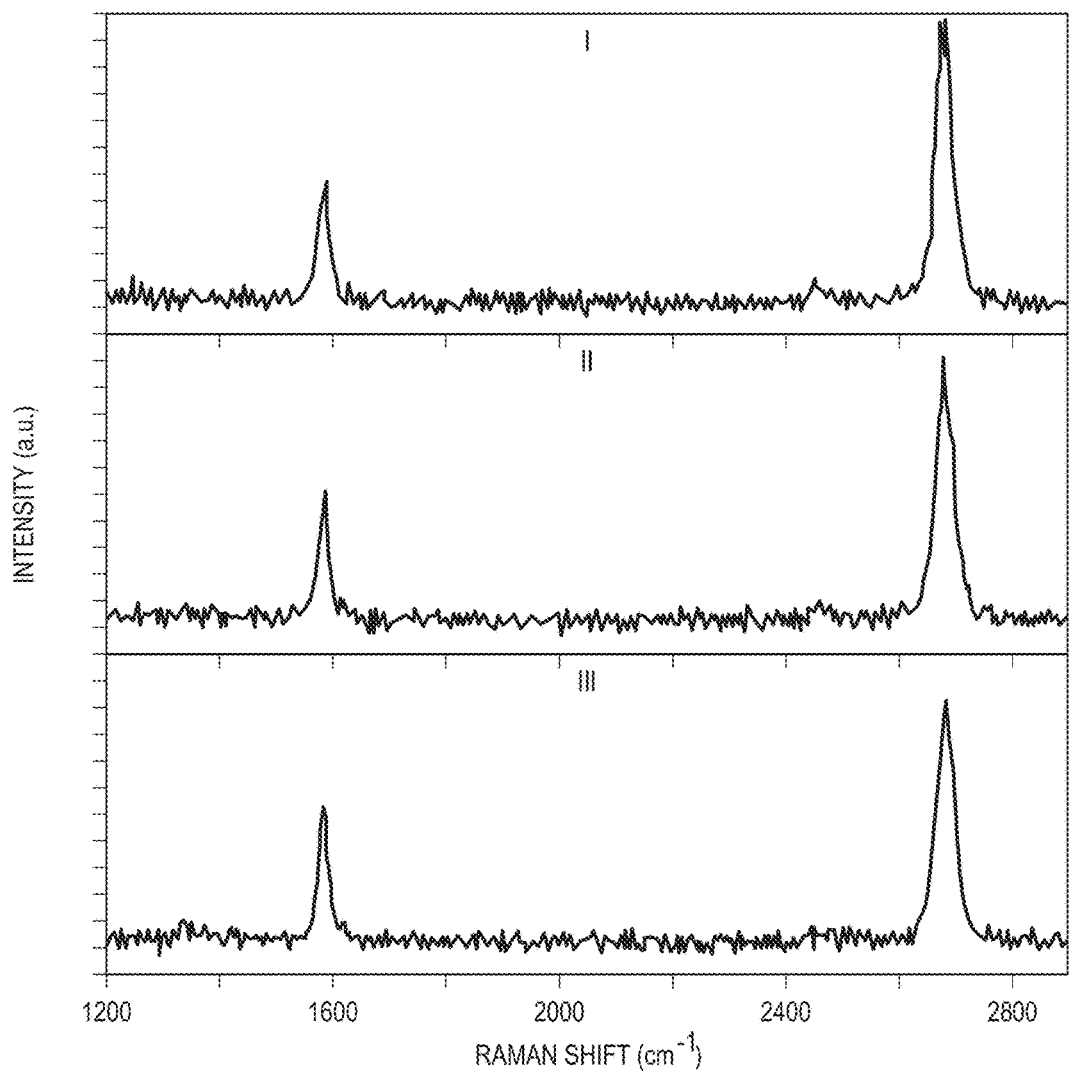
FIG. 8F is Raman spectra taken at positions (I), (II), and (III) in FIG. 8E for NG2.

The histograms of the G peak positions for the undoped and doped graphene samples are shown in FIG. 8D. There is a clear shift in the position of the G peak for doped graphene, indicating the charge carrier concentration is significantly altered by the nitrogen doping. The charge carrier concentration based on the shift in the position of the G peak in the Raman spectrum is estimated to be $1.1 \times 10^{13}$ cm$^{-2}$ for the doped graphene sample, which is much higher than the intrinsic electron and hole sheet densities in the undoped graphene ($\sim 9 \times 10^{10}$ cm$^{-2}$).

Figure 8G:
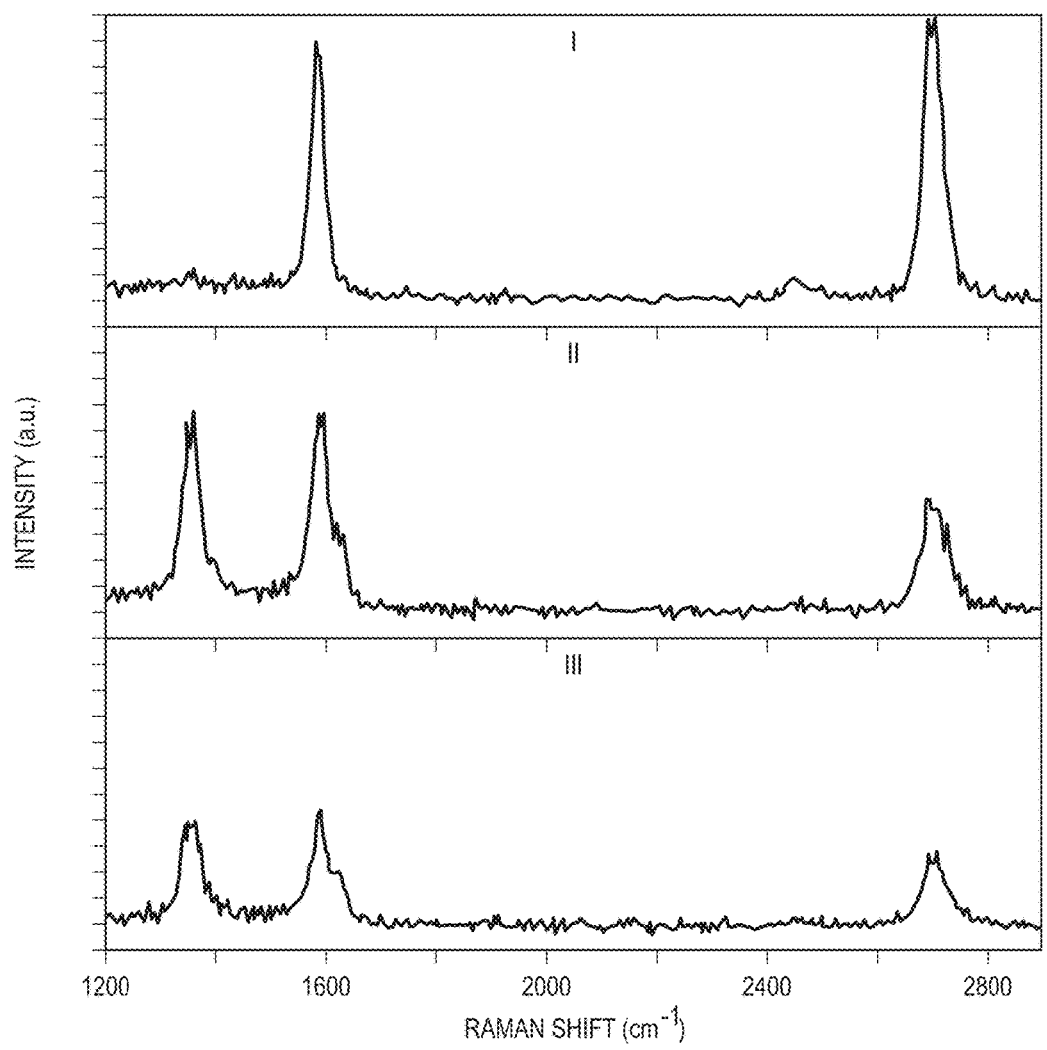
FIG. 8G is Raman spectra taken at positions (I), (II), and (III) in FIG. 8E for PG.

The ratio of the 2D/G peak intensity was shown to be sensitive to dopant, charge carrier, and defect concentration. FIG. 8E shows the Raman 2D/G peak intensity ratio mapping for undoped and doped graphene measured in the same area shown in FIG. 8A. The Raman spectra measured at different positions of the undoped graphene, illustrated in FIG. 8B, showed typical features of monolayer graphene: IG/I2D of ~0.5 and a symmetric 2D band centered at ~2680 cm$^{-1}$ with a full width at half-maximum of ~33 cm$^{-1}$. Little or no signal at the D band was observed, indicating a low defect density. In contrast, and as shown at FIG. 8G, the NG sample has a large D peak as well as changes in the intensity of the G and 2D bands in the dark regions of the 2D/G map as seen from the Raman spectra recorded in the regions indicated by (II) and (III) in FIG. 8E. In the bright regions marked by (I), the Raman spectrum has features similar to that of undoped graphene. The Raman spectra of doped graphene were consistent with the presence of dopants or defects while preserving the basic structural properties of the graphene sheet. Additionally, the 2D/G maps showed relatively uniform doping over the entire mapping area.

Figure 9C:
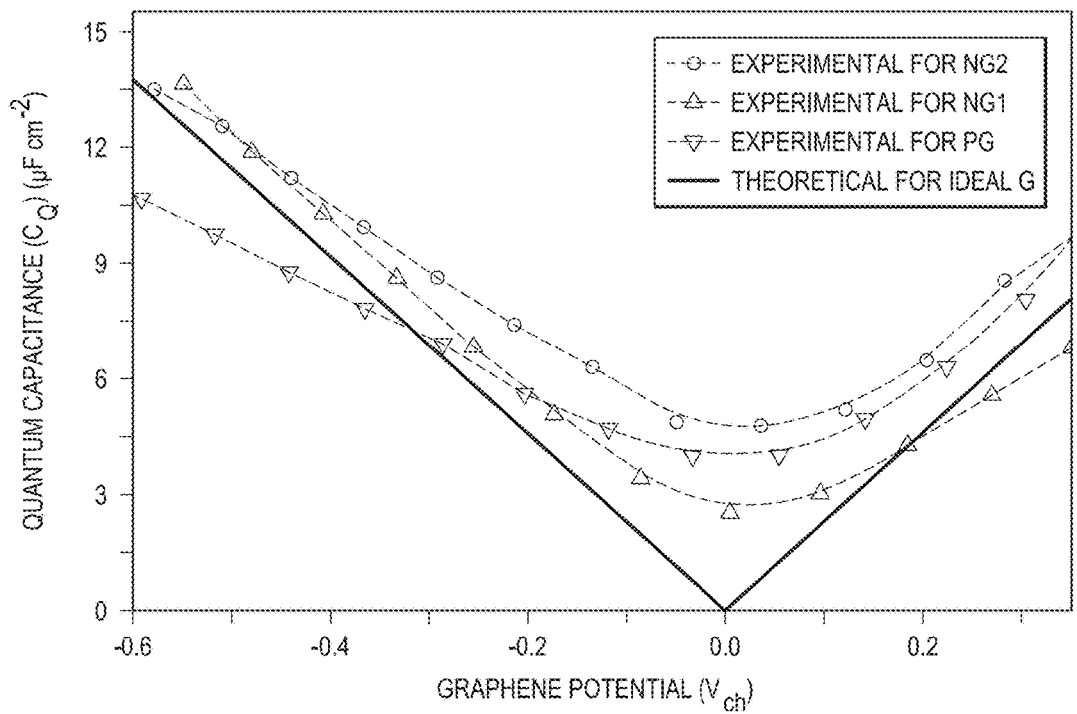
FIG. 9C plots of quantum capacitance for undoped and doped graphene samples derived from total capacitance.
Figure 9A:
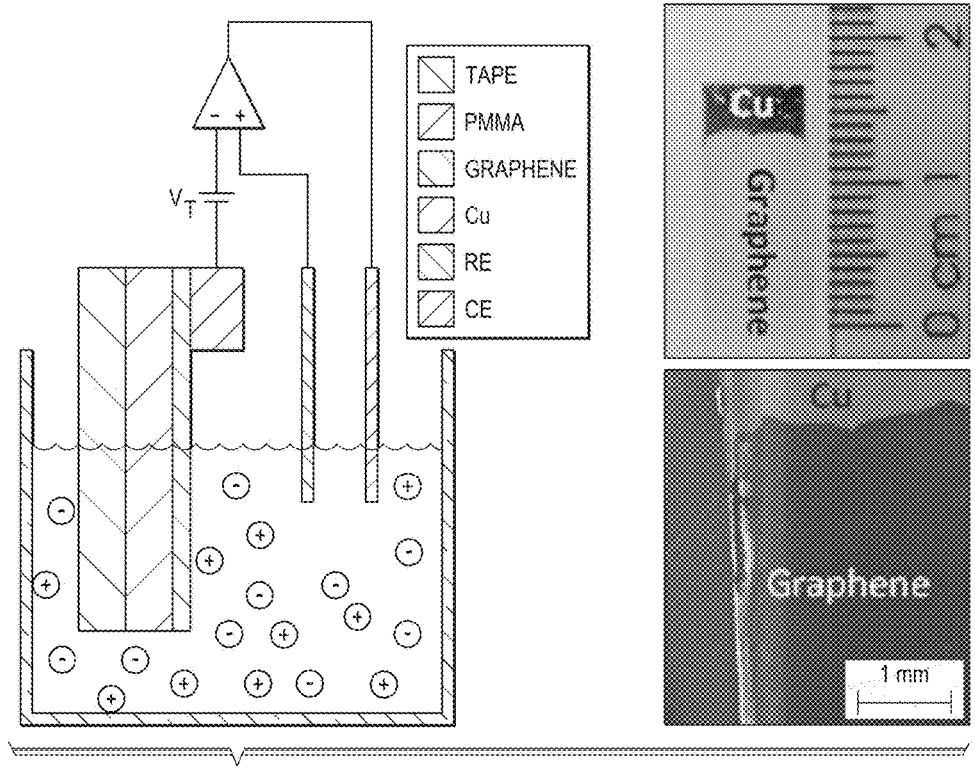
FIG. 9A is a schematic illustration of the setup for quantum capacitance measurement, a photograph showing the dimensions of the working electrode, and an SEM image showing contact between the graphene and the copper of the electrode.
Figure 9B:
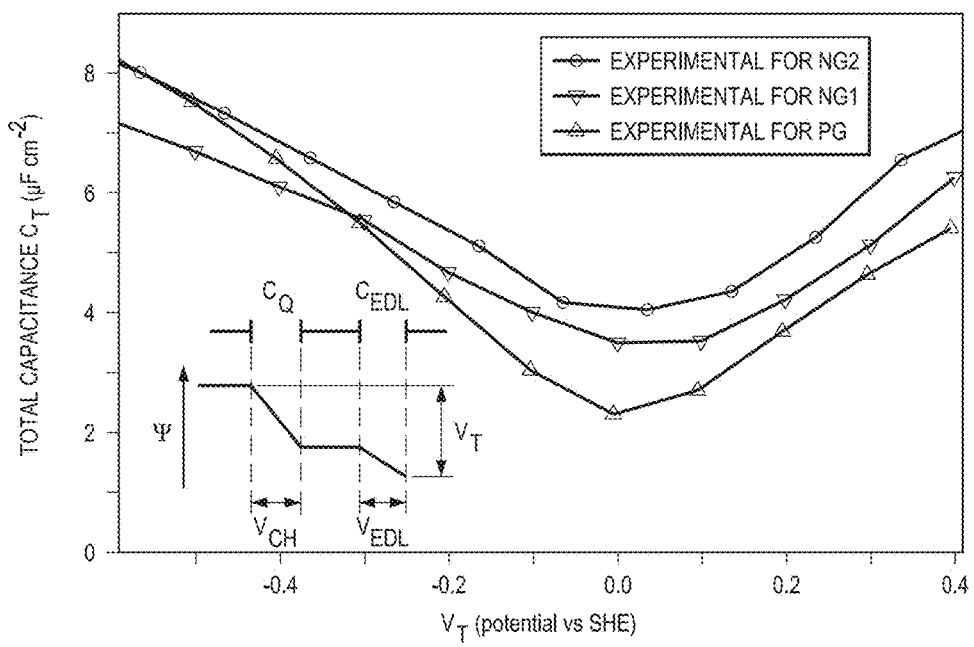
FIG. 9B plots of total capacitance as a function of the total gate potential for undoped (PG) and doped (NG1 and NG2) graphene materials.

FIG. 9A is a schematic illustration of the graphene capacitance measurement setup. As shown in FIG. 9B, total capacitance of the graphene increased with dopant concentration. The quantum capacitance for graphene similarly increased with dopant concentration, as illustrated in FIG. 9C.

The quantum capacitance arises from the kinetic, exchange-correlation, and electron-phonon interaction energies in the total function, and is closely related to the linear density of states of intrinsic carriers in the graphene sheet. As shown in FIG. 9D, there is a clear correlation between the modified quantum capacitance in undoped and doped graphene and the observed increase in capacitance of doped aMEGO relative to undoped aMEGO. This increased quantum capacitance has not been previously observed.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A material comprising an activated expanded graphite oxide comprising at least one dopant.

2. The material of claim 1, wherein the at least one dopant includes a non-metal.

3. The material of claim 2, wherein the at least one dopant is selected from the group consisting of silicon, phosphorus, boron, and nitrogen.

4. The material of claim 3, wherein the at least one dopant is nitrogen.

5. The material of claim 1, wherein the atomic percentage of the dopant in the activated expanded graphite oxide is between about 0.1% to about 10%.

6. The material of claim 1, wherein the specific surface area of the activated expanded graphite oxide is at least about 1900 m$^2$/g.

7. The material of claim 1, wherein the area-normalized capacitance of the activated expanded graphite oxide is at least 10 µg/cm$^2$.

* * * * *